US012522911B2

(12) United States Patent
Ban et al.

(10) Patent No.: US 12,522,911 B2

(45) Date of Patent: Jan. 13, 2026

(54) SYSTEMS AND METHODS FOR VAPORIZATION AND VAPOR DISTRIBUTION

(71) Applicant: First Solar, Inc., Tempe, AZ (US)

(72) Inventors: Zhigang Ban, Perrysburg, OH (US); John Barden, Perrysburg, OH (US); Jerry Drennan, Sylvania, OH (US); Litian Liu, Fremont, CA (US); Rick Powell, Ann Arbor, MI (US); Nirav Vora, Lehi, UT (US); Yaojun Xu, San Jose, CA (US)

(73) Assignee: First Solar, Inc., Tempe, AZ (US)

( * ) Notice: Subject to any disclaimer, the term of this patent is extended or adjusted under 35 U.S.C. 154(b) by 261 days.

(21) Appl. No.: 16/758,258

(22) PCT Filed: Oct. 24, 2018

(86) PCT No.: PCT/US2018/057297

§ 371 (c)(1),
(2) Date: Apr. 22, 2020

(87) PCT Pub. No.: WO2019/084125

PCT Pub. Date: May 2, 2019

(65) Prior Publication Data

US 2020/0270744 A1 Aug. 27, 2020

Related U.S. Application Data

(60) Provisional application No. 62/577,384, filed on Oct. 26, 2017.

(51) Int. Cl.
*C23C 14/24* (2006.01)

(52) U.S. Cl.
CPC .................................. *C23C 14/243* (2013.01)

(58) Field of Classification Search
CPC .................................................... C23C 14/243
See application file for complete search history.

(56) References Cited

U.S. PATENT DOCUMENTS 3,291,619 A * 12/1966 Luks ........................ C04B 33/13 501/154
3,850,679 A * 11/1974 Sopko ................... C03C 17/002 427/255.19
4,222,434 A * 9/1980 Clyde ........................ F28F 9/22 165/181
4,361,284 A * 11/1982 Kalbskopf ............ C23C 16/453 239/455
5,122,394 A * 6/1992 Lindner ................ C03C 17/002 427/166
5,421,895 A * 6/1995 Tsubouchi ............... B01D 1/14 392/399
5,835,677 A * 11/1998 Li ........................ C23C 16/4486 392/401

(Continued)

OTHER PUBLICATIONS

PCT International Search Report and Written Opinion, Application No. PCT/US2018/057297, dated Jan. 29, 2019.

*Primary Examiner* — Keath T Chen
(74) *Attorney, Agent, or Firm* — MacMillan, Sobanski & Todd, LLC

(57) ABSTRACT

Distributor assemblies for vapor transport deposition systems, and methods of conducting vapor transport deposition, are described.

20 Claims, 20 Drawing Sheets

(56) References Cited

U.S. PATENT DOCUMENTS

Figure 2:
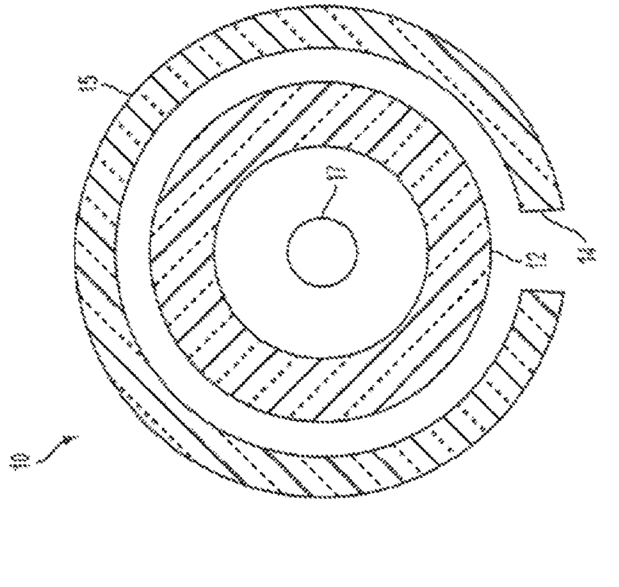

| | | | | |
|---|---|---|---|---|
| 6,050,884 | A * | 4/2000 | Togawa ................ B24B 41/005 451/73 | |
| 8,163,089 | B2 | 4/2012 | Rathweg et al. | |
| 8,382,901 | B2 | 2/2013 | Powell et al. | |
| 2006/0236940 | A1* | 10/2006 | Powell .............. H01L 21/02422 118/726 | |
| 2012/0024232 | A1 | 2/2012 | Lee et al. | |
| 2012/0122276 | A1* | 5/2012 | Probst ..................... C23C 14/28 438/102 | |
| 2012/0141676 | A1* | 6/2012 | Sershen .............. C23C 16/4412 118/729 | |
| 2016/0281212 | A1* | 9/2016 | Beck ..................... C23C 14/243 | |
| 2017/0067155 | A1* | 3/2017 | Li ....................... C23C 14/5833 | |
| 2020/0024733 | A1* | 1/2020 | Bulovic ................ C23C 14/243 | |

* cited by examiner

SYSTEMS AND METHODS FOR VAPORIZATION AND VAPOR DISTRIBUTION

CROSS-REFERENCE TO RELATED APPLICATIONS

This is a national phase application of international application PCT/US2018/057297, filed Oct. 24, 2018, and claims the benefit of U.S. Application 62/577,384, filed under 35 U.S.C. § 111(b) on Oct. 26, 2017; each of which is incorporated by reference in the entirety.

BACKGROUND

Thin film photovoltaic devices may contain several material layers deposited sequentially over a substrate, including semiconductor material layers which form a p-type absorber layer, an n-type window layer, or both. Vapor deposition is one technique which can be used for depositing semiconductor material layers over a substrate. In vapor deposition, a semiconductor material in solid form is vaporized under high temperatures with the vapor flow being directed towards a substrate where it condenses on the substrate a thin solid film. One such vapor deposition technique is known as vapor transport deposition (VTD). An example of a known VTD system is described in U.S. Pat. No. 5,945,163. In a VTD system, as shown in U.S. Pat. No. 5,945,163, a semiconductor material in a powder form is continuously supplied to the interior of a permeable vaporization chamber with the assistance of a carrier gas. The vaporization chamber is heated to a high temperature sufficient to vaporize the powder, with the vapor passing through a permeable wall of the vaporization chamber. The vapor is then directed by a distributor towards, and condenses as a thin film on, a substrate which moves past one or more orifices of the distributor which directs the vapor towards the substrate.

In order to achieve a high production line throughput, each semiconductor material is generally deposited in a single stage deposition as a single layer on the substrate to a desired thickness. To achieve the desired thickness with a high production speed, a large volume of semiconductor powder must be vaporized in a short time, which requires that the semiconductor powder be heated to a high temperature in the vaporization chamber.

VTD systems typically include a powder delivery unit, a powder vaporizer, a vapor distributor, and a vacuum deposition unit. VTD powder vaporizers are generally designed to vaporize or sublimate raw material powder into a gaseous form. In conventional powder vaporizers, raw material powder from a powder delivery unit is combined with a carrier gas and injected into a vaporizer formed as a permeable heated cylinder. The material is vaporized in the cylinder and the vaporized material diffuses through the permeable walls of the vaporizer into a vapor distributor. The distributor typically surrounds the vaporizer cylinder and directs collected vapors towards openings which face towards a substrate for thin film material deposition on the substrate.

Figure 1:
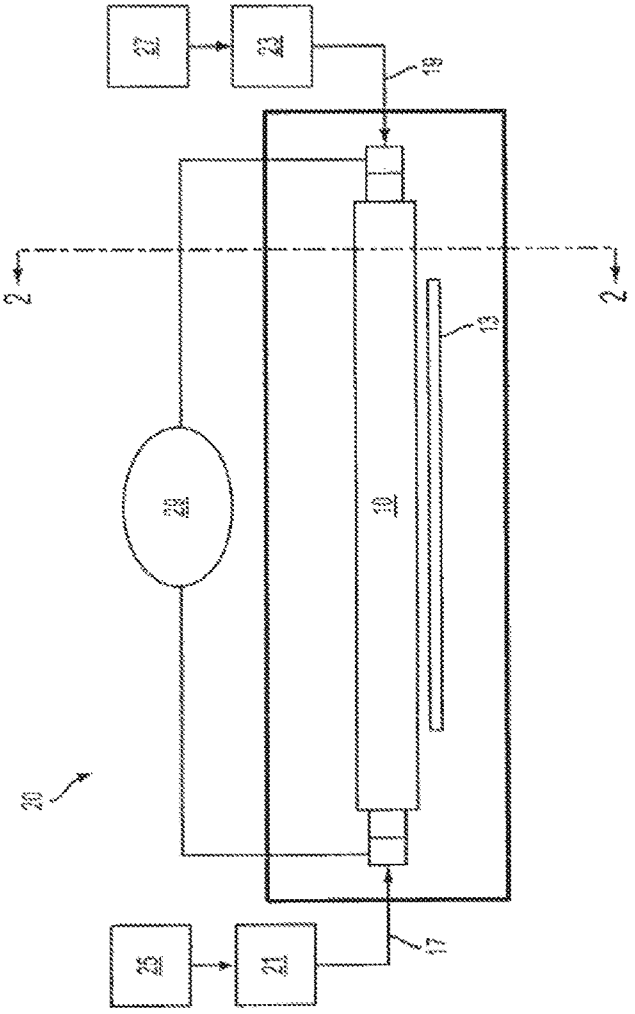

FIG. 1 illustrates one example of a conventional vapor transport deposition system 20 for delivering and depositing a semiconductor material, for example CdS or CdTe, onto a substrate 13, for example, the substrate 13 can be a glass substrate, used in the manufacture of thin film solar modules. Inert carrier gas sources 25 and 27, for example, Helium gas (He) or Nitrogen gas (N2) sources, respectively provide a carrier gas to powder feeders 21 and 23, which contain CdS or CdTe powder material. The gas transports the semiconductor material through injector ports 17, 19 on opposite ends of a vaporizer and distributor assembly 10. The vaporizer and distributor assembly 10 vaporizes the semiconductor material powder and distributes it for deposition onto substrate 13.

FIG. 2 is a cross-sectional view, taken along the section line 2-2 of FIG. 1, of one example of a conventional powder vaporizer and distributor assembly 10. The vaporizer 12 is constructed as a heated tubular permeable member. It is formed of a resistive material which can be heated by the AC power source 29 and vaporizes, for example, a CdS or CdTe semiconductor material powder transported by the carrier gas into vaporizer 12 through injector ports 17, 19. The distributor 15 is a housing heated by radiant heat from vaporizer 12 and/or from another source. The housing of distributor 15 surrounds vaporizer 12 to capture CdS or CdTe semiconductor material vapor that diffuses through the walls of vaporizer 12. The semiconductor material vapor is directed by a distributor towards a slot or series of holes 14 which face a surface of a substrate 13, which moves past the vaporizer and distributor assembly 10. More detailed examples of VTD systems of the type illustrated can be found in, for example, U.S. Pat. Nos. 5,945,163, 5,945,165, 6,037,241, and 7,780,787.

Temperatures typically used for VTD deposition are in the range of from about 500° C. to about 1200° C., with higher temperatures in this range being preferred for a high deposition throughput. The vaporizer 12 can be formed as a heatable tubular permeable member formed of silicon carbide (SiC). The distributor 15 can be formed of a shroud of ceramic material, such as mullite. Vapor deposition occurs within a housing which contains a substrate transport mechanism such as driven rollers. Ceramic sheets may also be used as heat shields within the housing. When the semiconductor material to be deposited contains tellurium, vaporization at the higher temperature can cause materials of the tubular permeable member, the mullite shroud, ceramic sheets, and other equipment associated with the deposition, to also vaporize and chemically react with tellurium to form a tellurium chemical species vapor which can be deposited with the tellurium-containing semiconductor material. This, in turn, leads to undesired impurities being present in the deposited semiconductor film as a contaminant. Some of these impurities may include tantalum, cobalt, copper, vanadium, iron, antimony, zirconium, tin, silicon, and aluminum. If the impurities have a high enough concentration in the deposited film, they may adversely affect the electrical performance of the tellurium-containing semiconductor material.

It would be advantageous to discover new and improved methods and apparatuses for vapor transport deposition.

DRAWINGS

FIG. 1 schematically depicts a conventional vapor transport deposition (VTD) system.

FIG. 2 schematically depicts a cross-sectional view taken along the direction of line 2-2 of the VTD system of FIG. 1.

Figure 3:
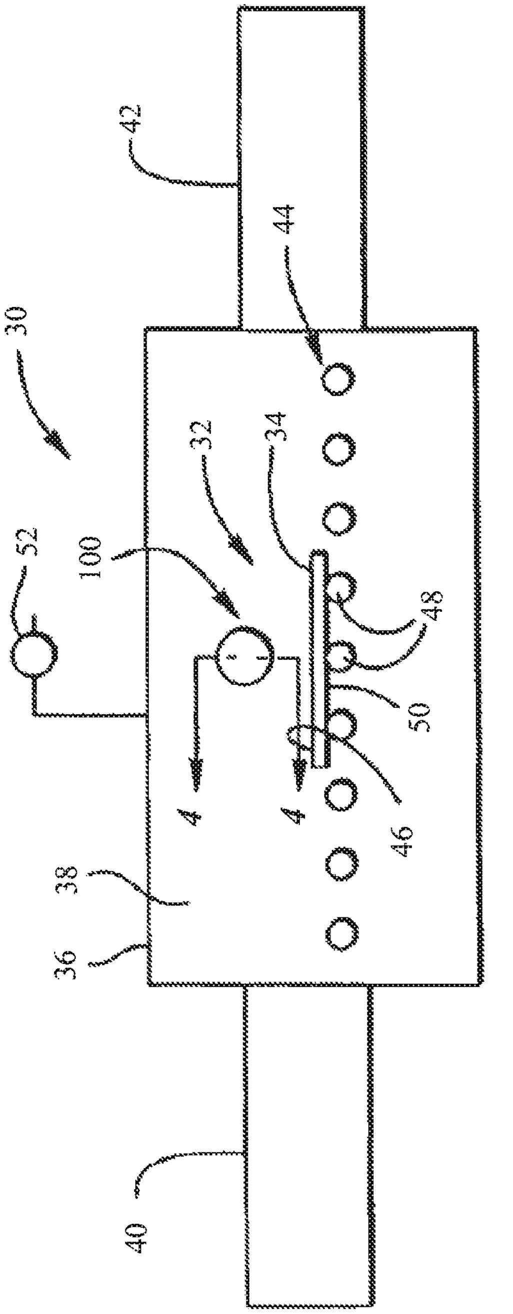

FIG. 3 schematically depicts a side perspective view of a processing system according to one or more embodiments shown and described herein.

Figure 4:
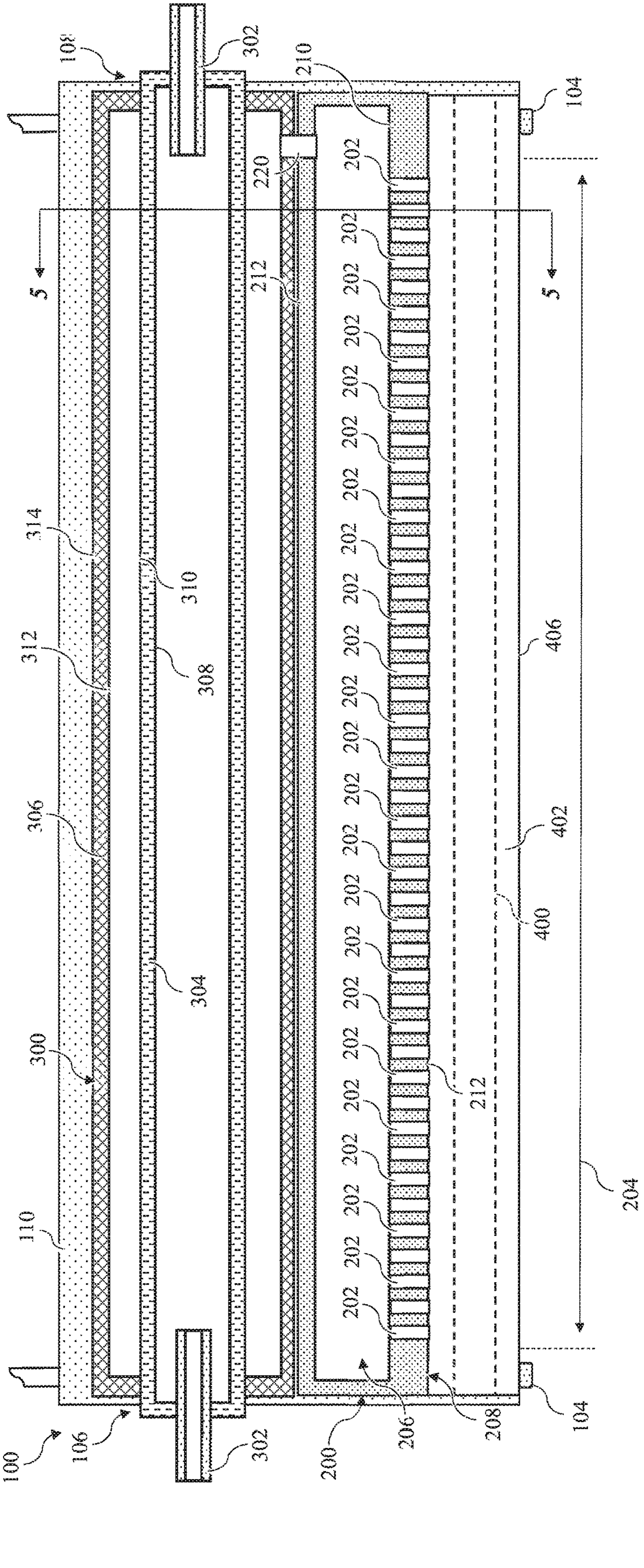

FIG. 4 schematically depicts a cross-sectional view taken along the direction of line 4-4 of the distributor assembly of the processing system of FIG. 3 according to one or more embodiments shown and described herein.

Figure 5:
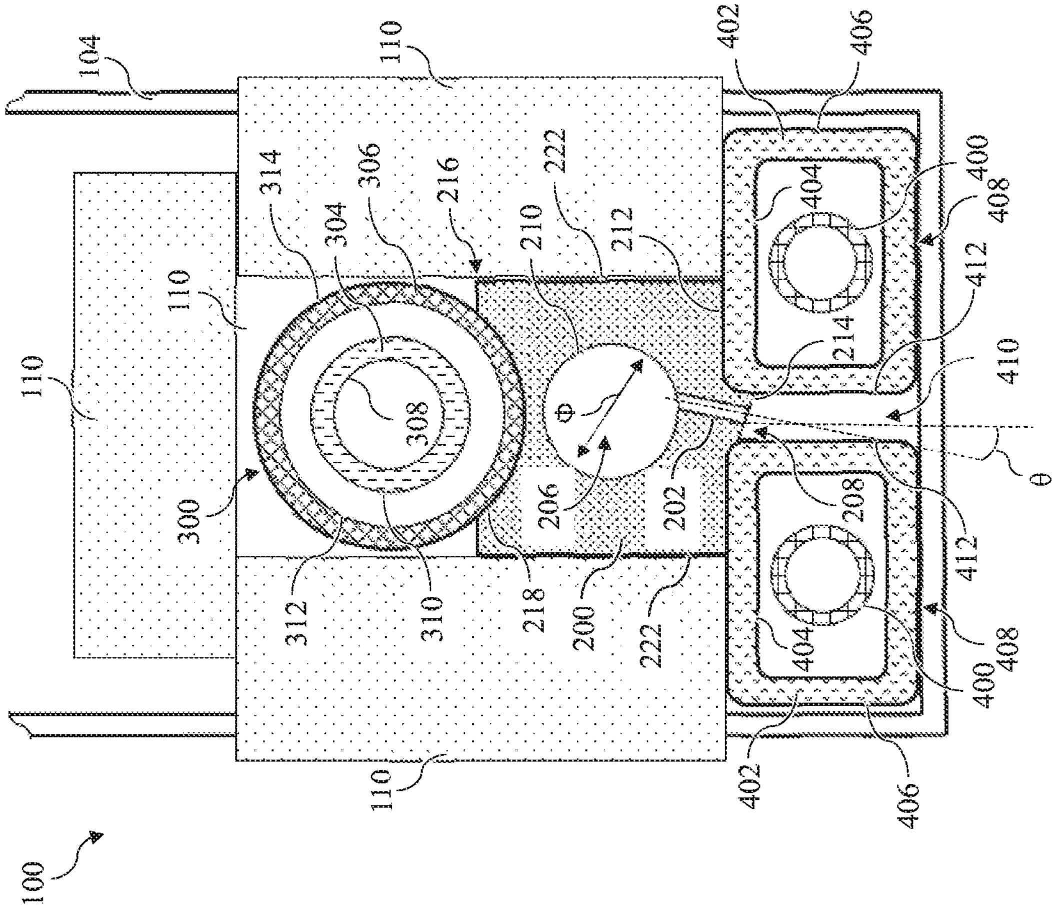

FIG. 5 schematically depicts a cross-sectional view taken along the direction of line 5-5 of the distributor assembly of FIG. 4 according to one or more embodiments shown and described herein.

Figure 6B:
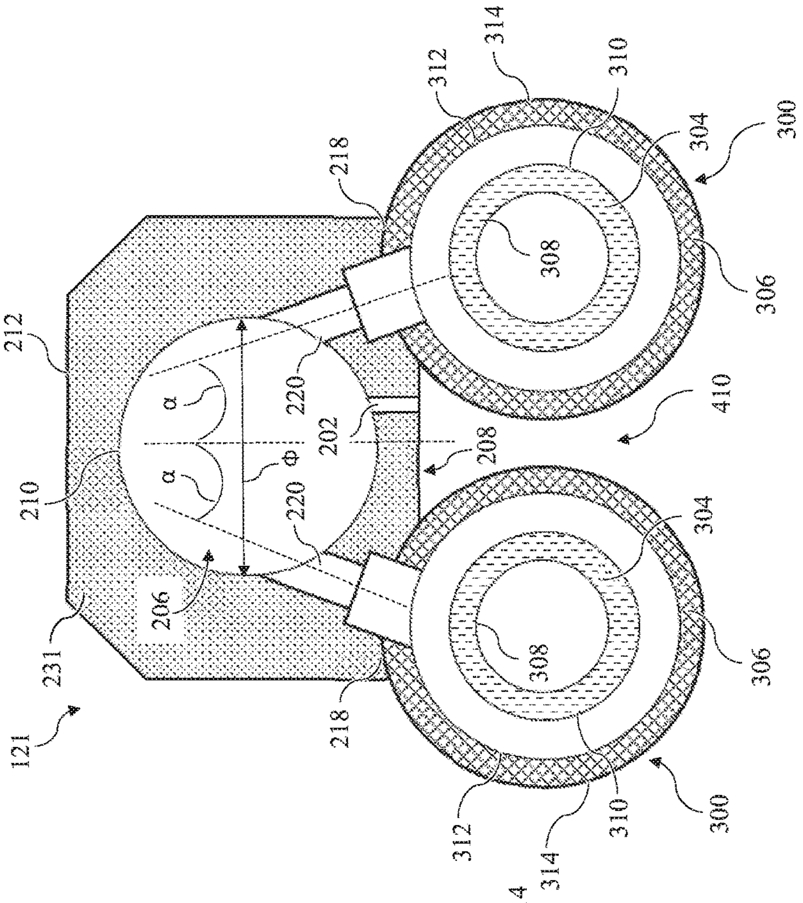
Figure 6A:
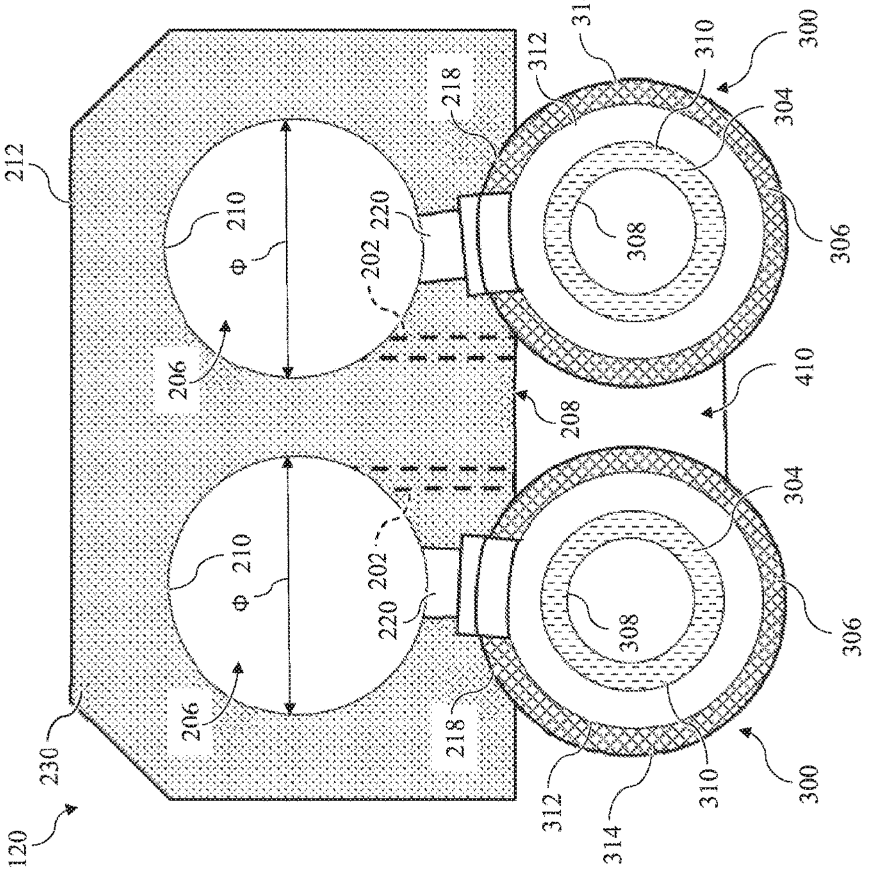

FIG. 6A schematically depicts a cross-sectional view of a distributor assembly having two channels according to one or more embodiments shown and described herein.

FIG. 6B schematically depicts a cross-sectional view of a distributor assembly having a single channel according to one or more embodiments shown and described herein.

Figure 7:
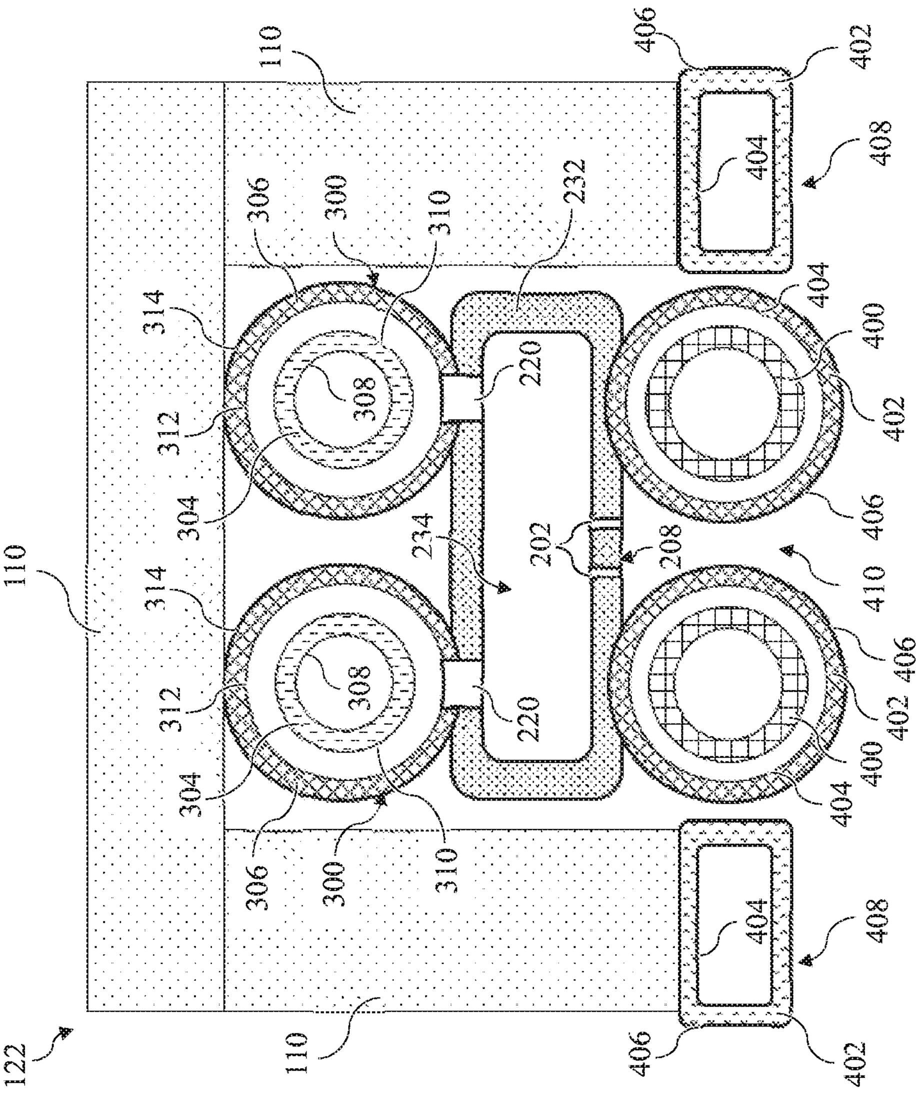

FIG. 7 schematically depicts a cross-sectional view of a distributor assembly, having four heaters and a SiC manifold according to one or more embodiments shown and described herein.

Figure 8:
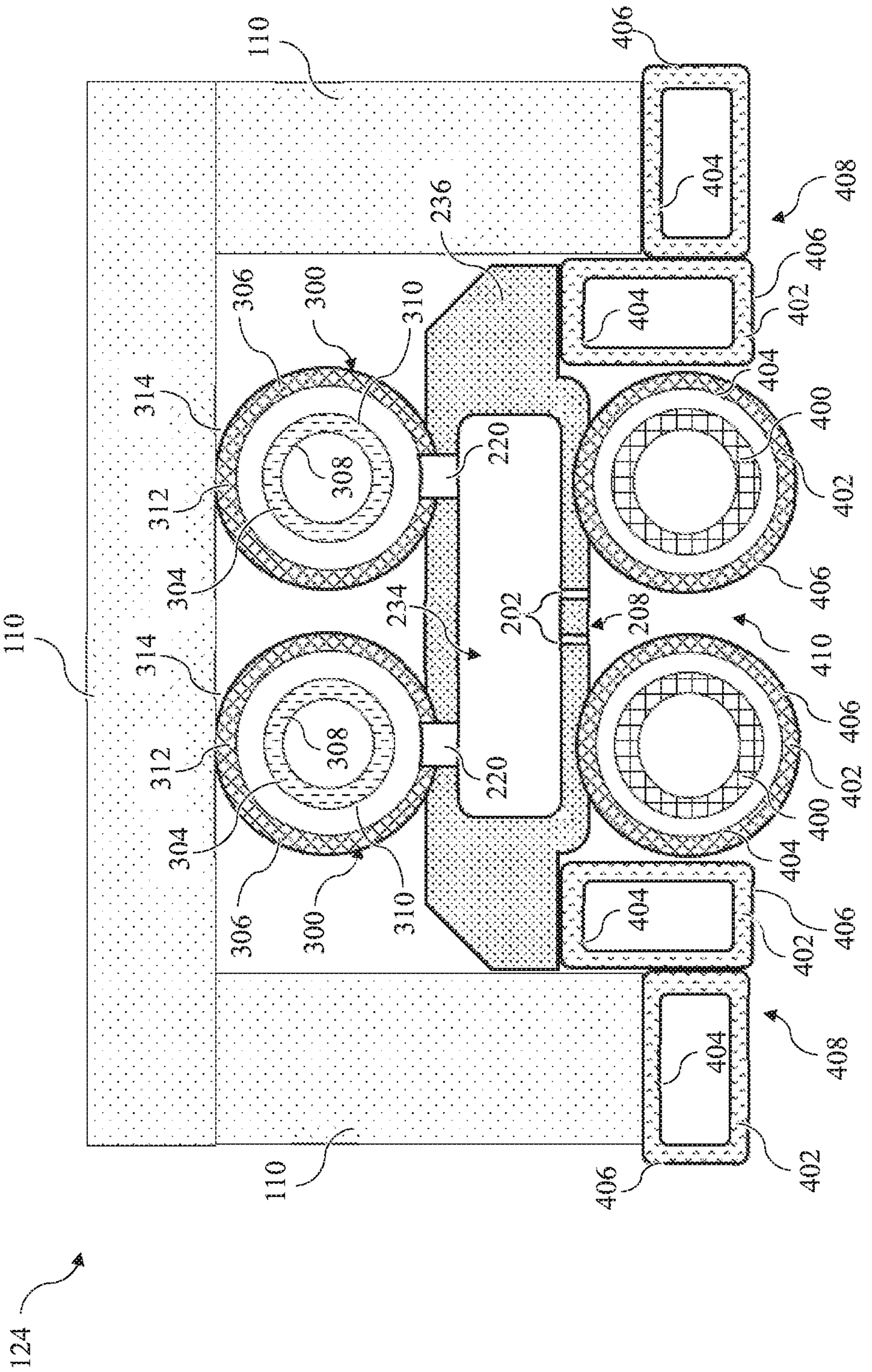

FIG. 8 schematically depicts a cross-sectional view of a distributor assembly, having two heaters and two vaporizers around a silica manifold according to one or more embodiments shown and described herein.

Figure 9B:
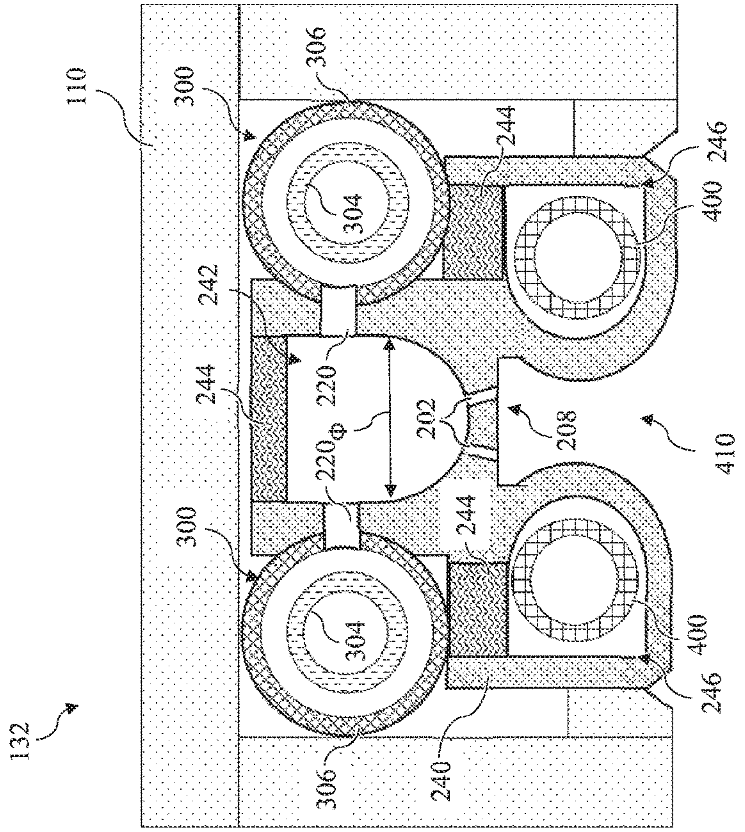
Figure 9A:
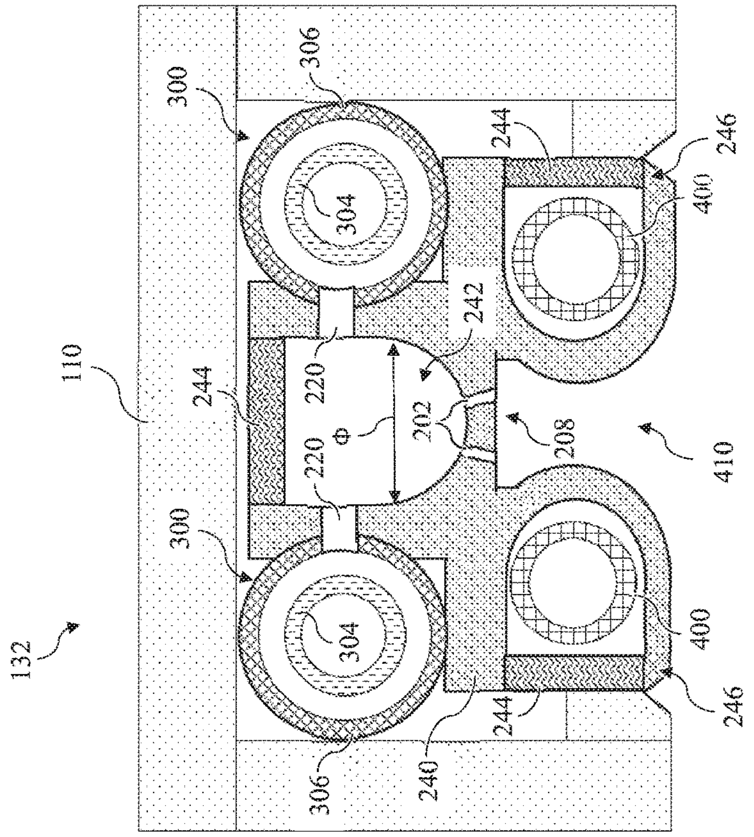

FIGS. 9A and 9B schematically depict a cross-sectional views of distributor assemblies according to one or more embodiments shown and described herein.

Figure 10B:
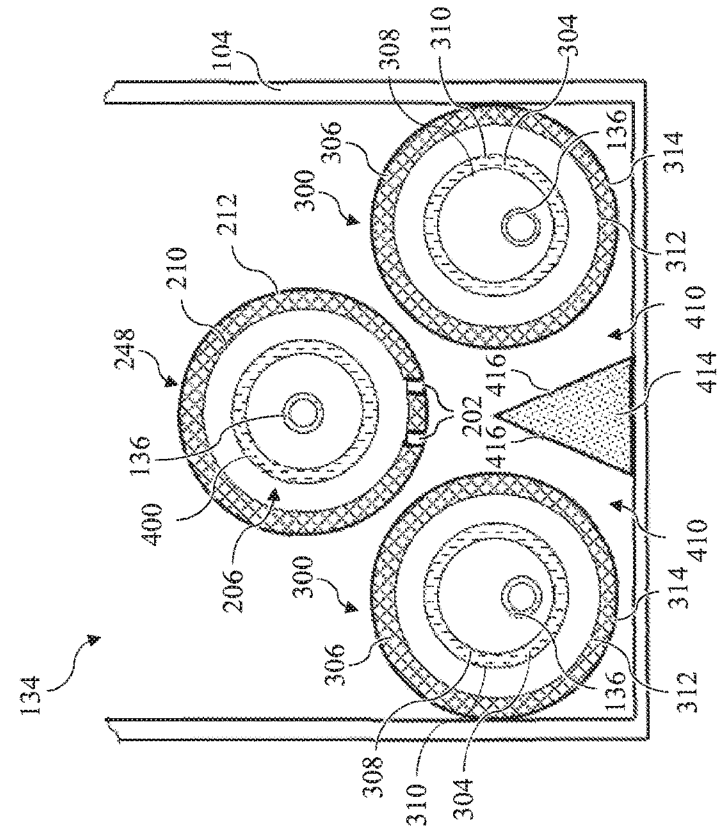
Figure 10A:
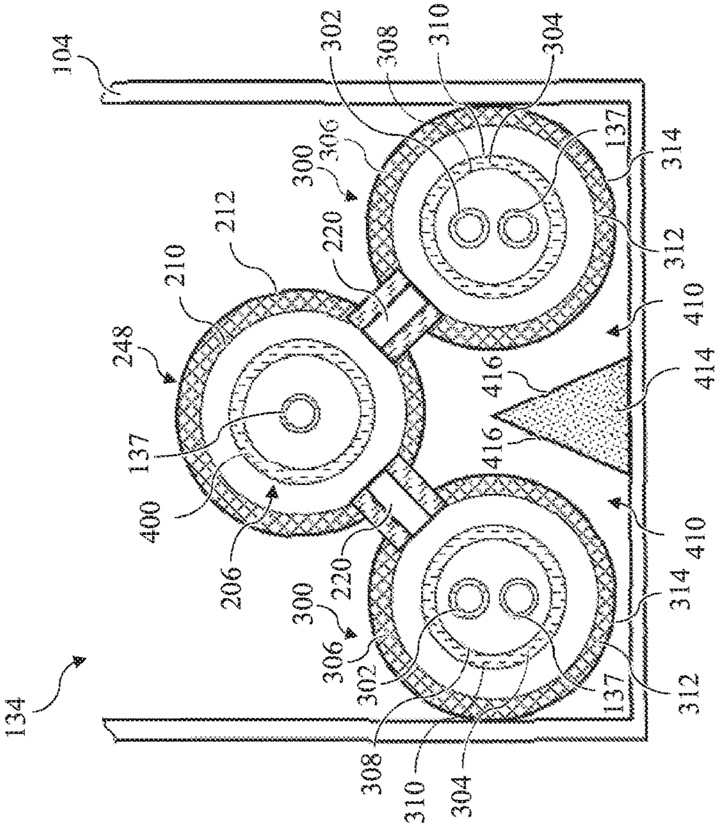

FIG. 10A schematically depicts a cross-sectional view of a distributor assembly, taken at an end of the distributor assembly, according to one or more embodiments shown and described herein.

FIG. 10B schematically depicts a cross-sectional view of the distributor assembly of FIG. 11A, taken near the center of the distributor assembly, according to one or more embodiments shown and described herein.

Figure 11:
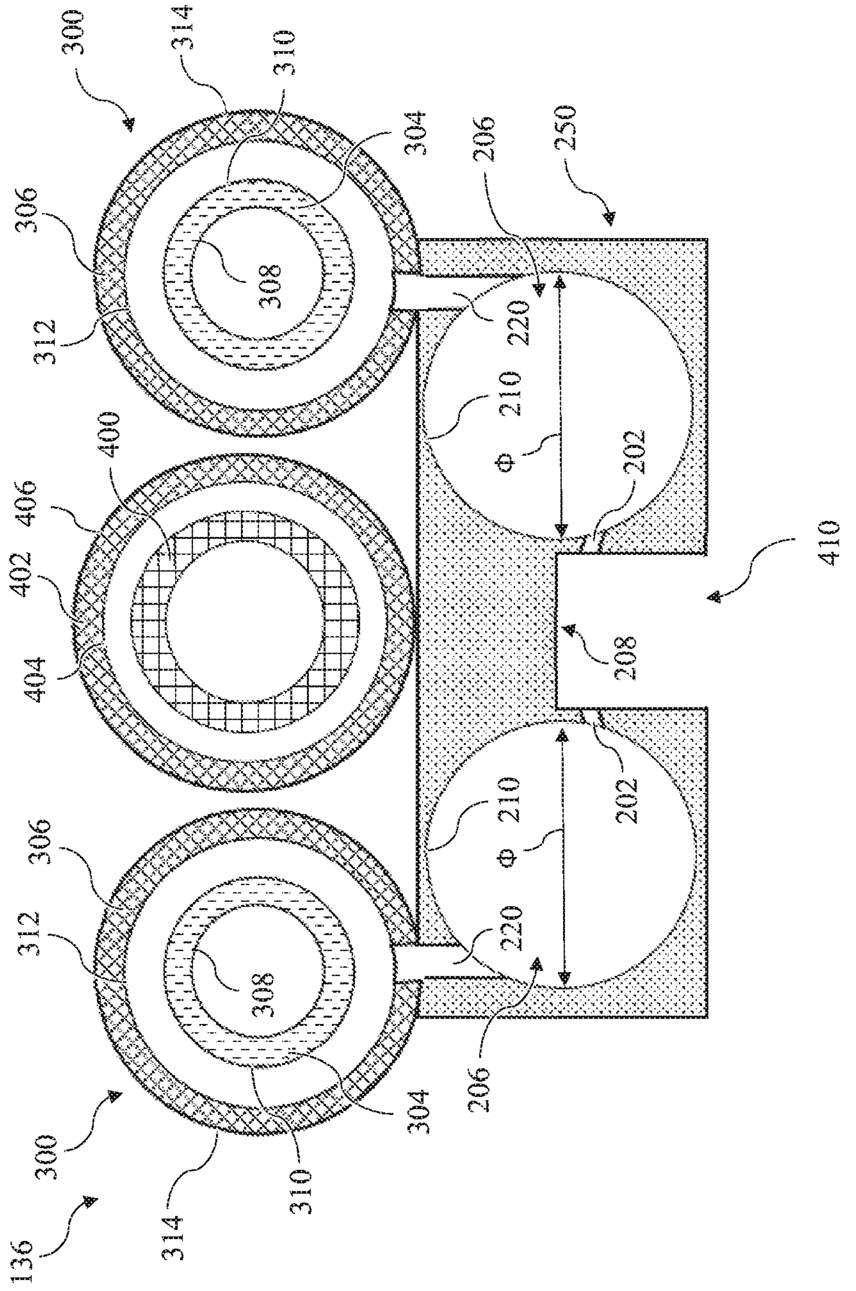

FIG. 11 schematically depicts a cross-sectional view of a distributor assembly according to one or more embodiments shown and described herein.

Figure 12:
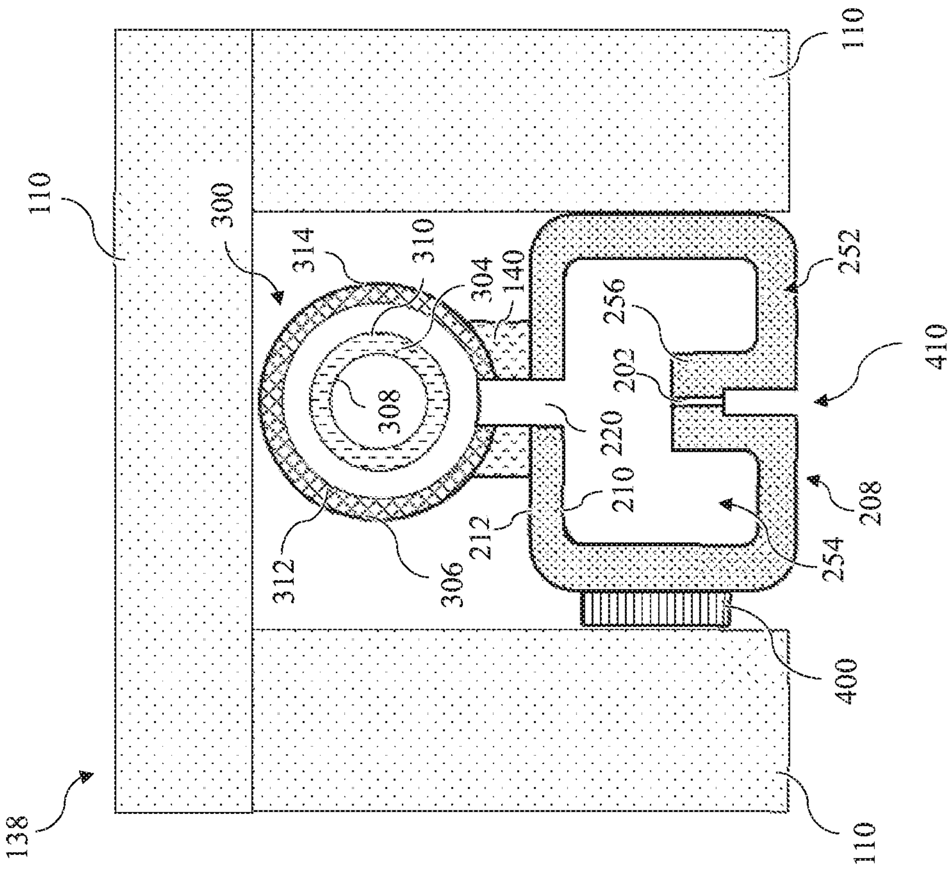

FIG. 12 schematically depicts a cross-sectional view of a distributor assembly having a resistively heated manifold according to one or more embodiments shown and described herein.

Figure 13:
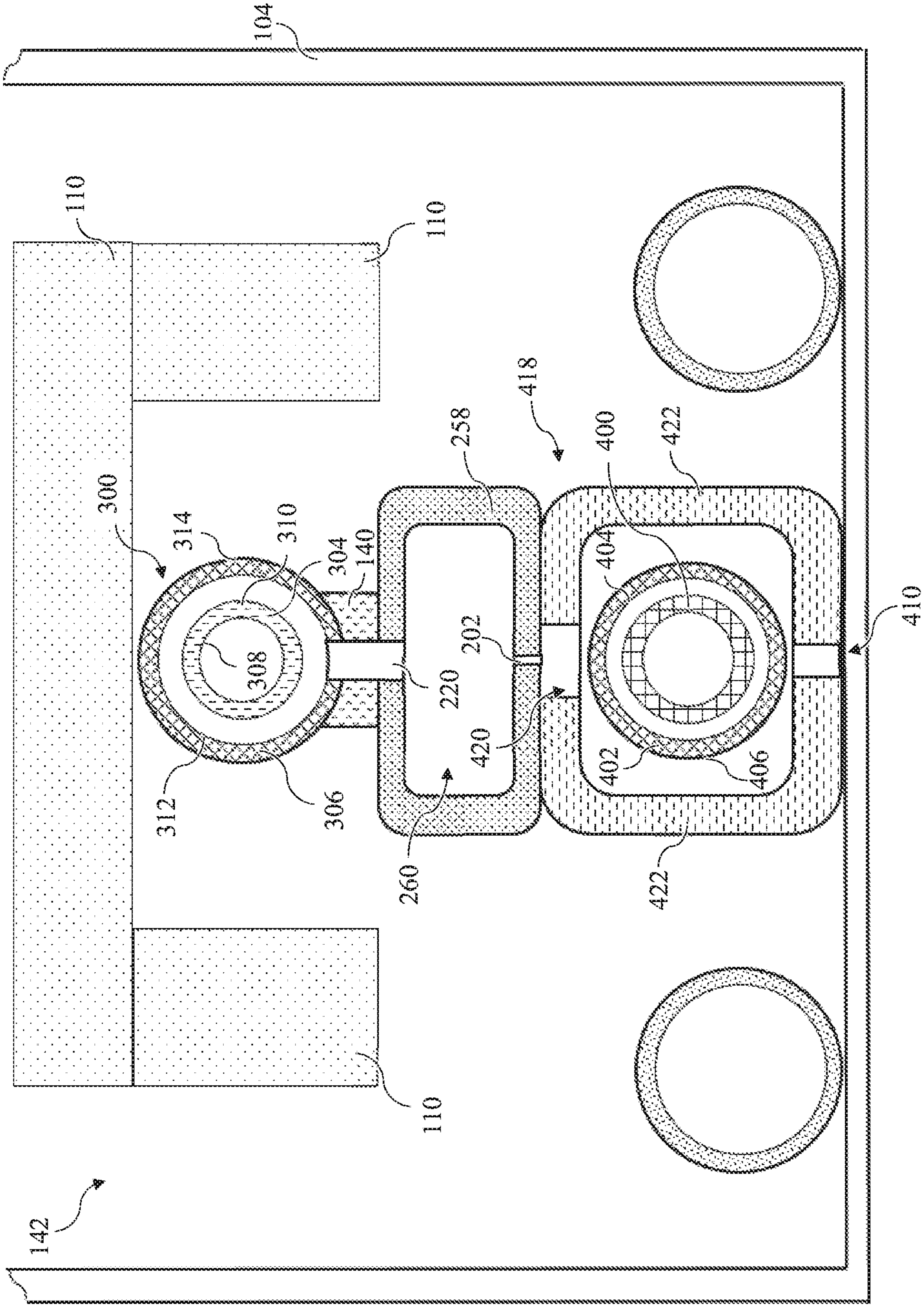

FIG. 13 schematically depicts a cross-sectional view of a distributor assembly having partial beams according to one or more embodiments shown and described herein.

Figure 14:
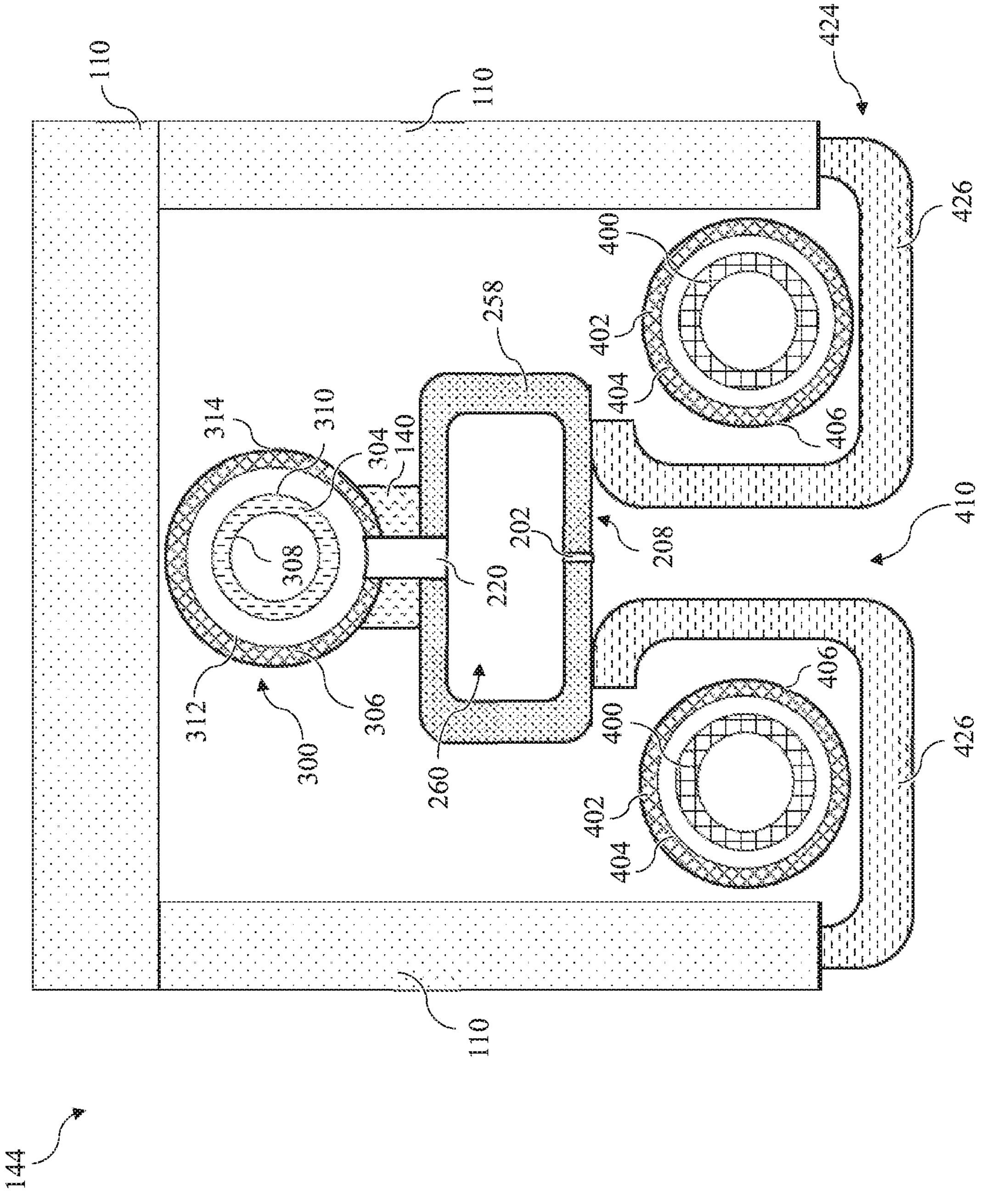

FIG. 14 schematically depicts a cross-sectional view of a distributor assembly having partial beams according to one or more embodiments shown and described herein.

Figure 15:
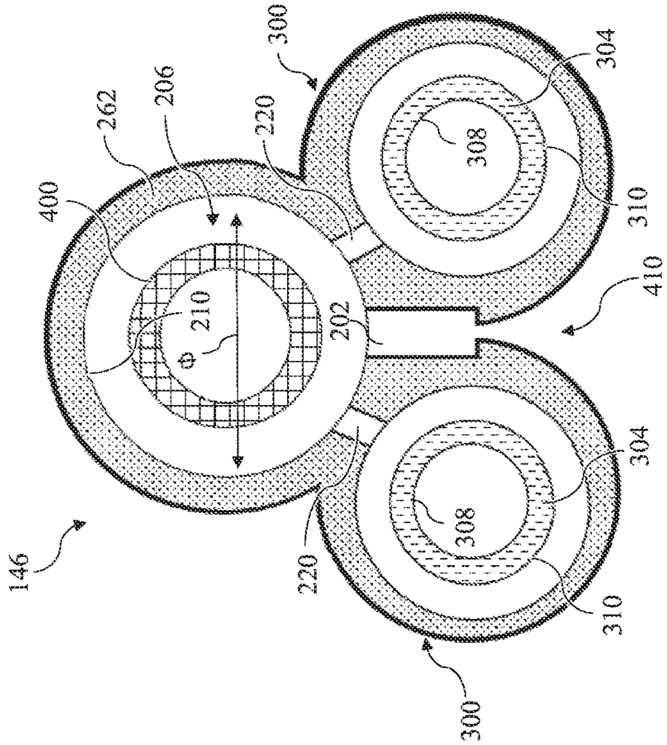

FIG. 15 schematically depicts a cross-sectional view of a distributor assembly having key elements cast from silica and an integrated housing according to one or more embodiments shown and described herein.

Figure 16:
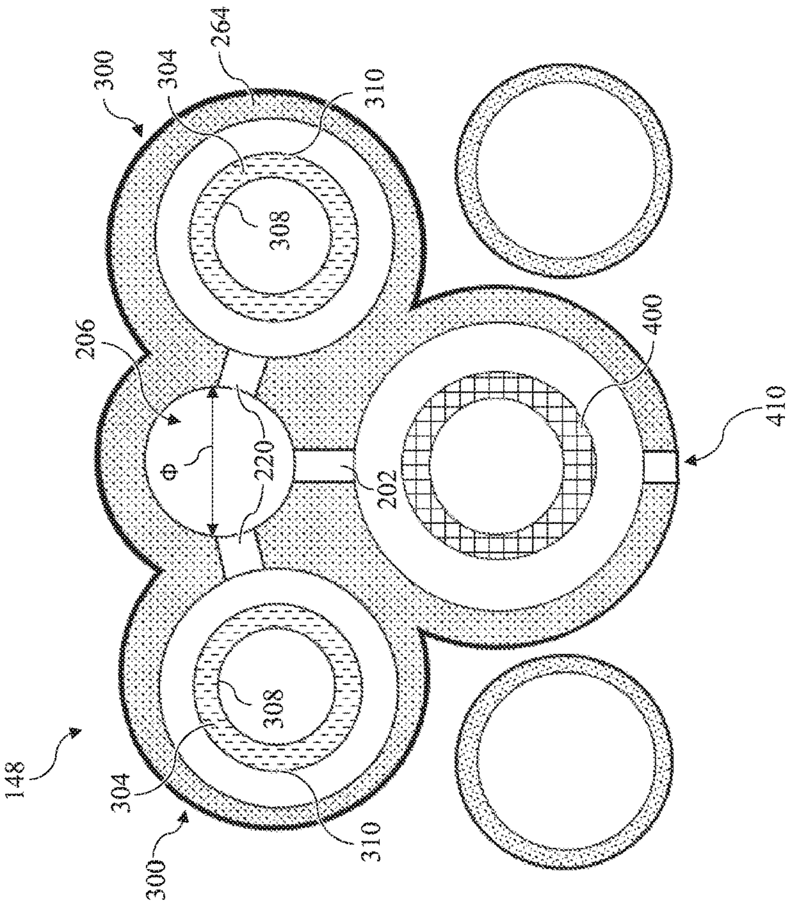

FIG. 16 schematically depicts a cross-sectional view of a distributor assembly having key elements cast from silica and an integrated housing according to one or more embodiments shown and described herein.

Figure 17:
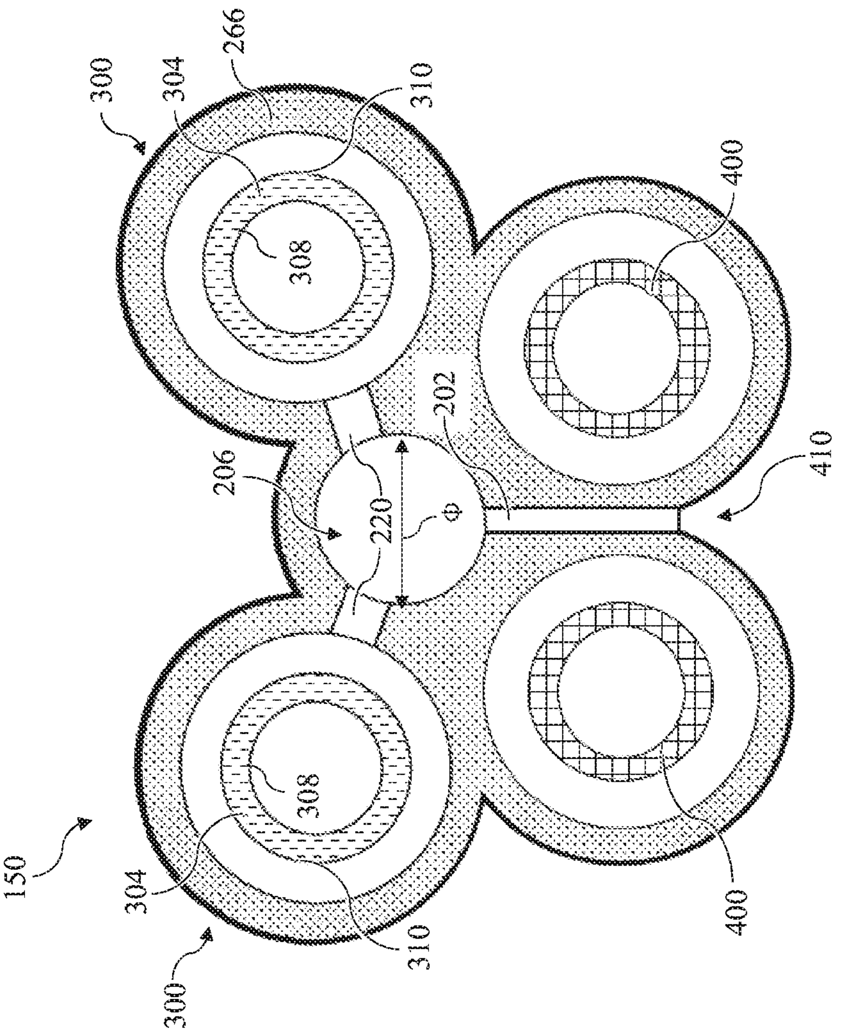

FIG. 17 schematically depicts a cross-sectional view of a distributor assembly having key elements cast from silica and an integrated housing according to one or more embodiments shown and described herein.

Figure 18:
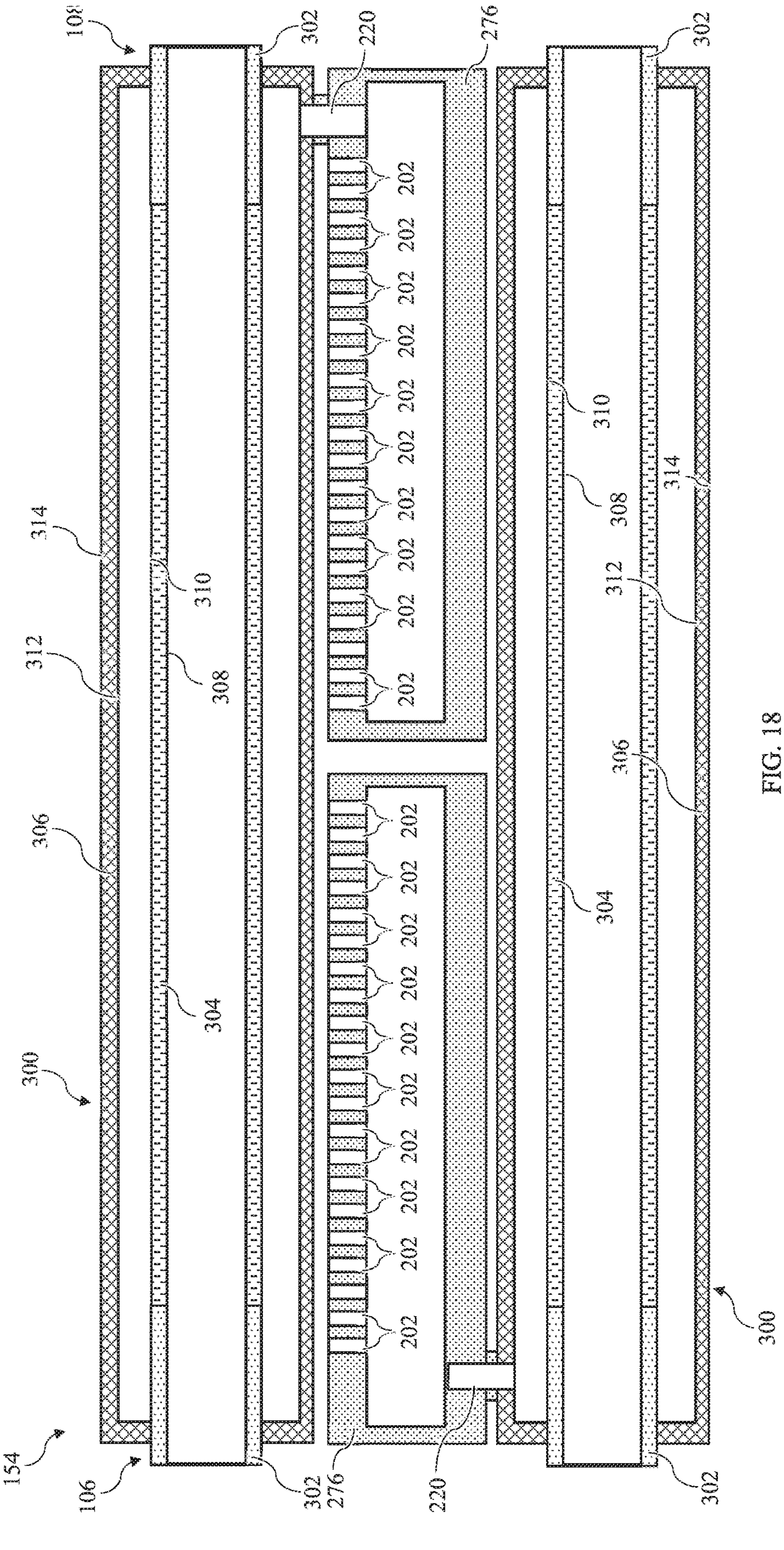

FIG. 18 schematically depicts a distributor assembly according to one or more embodiments shown and described herein.

Figure 19:
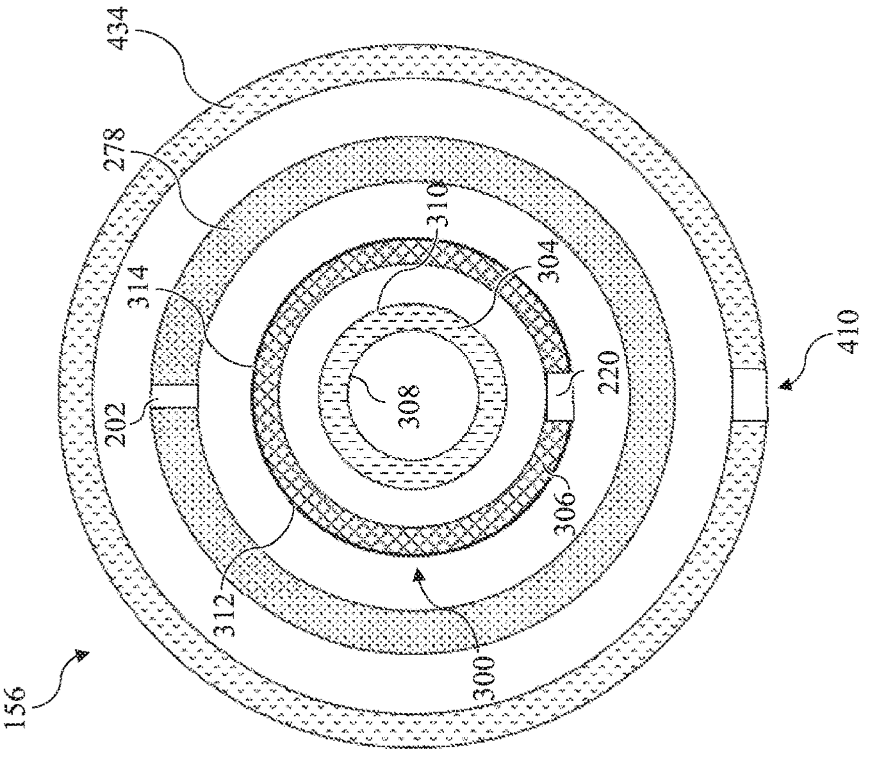

FIG. 19 schematically depicts a distributor assembly having a concentric configuration according to one or more embodiments shown and described herein.

Figure 20:
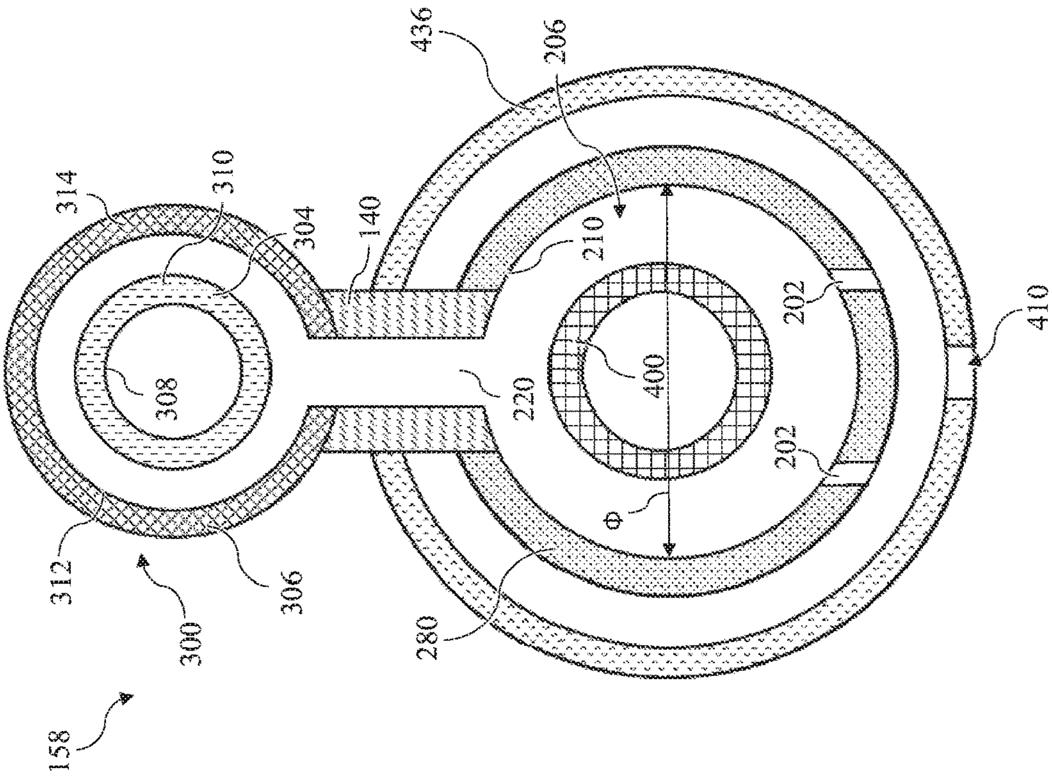

FIG. 20 schematically depicts a distributor assembly having a double barrel configuration according to one or more embodiments shown and described herein.

Figure 21:
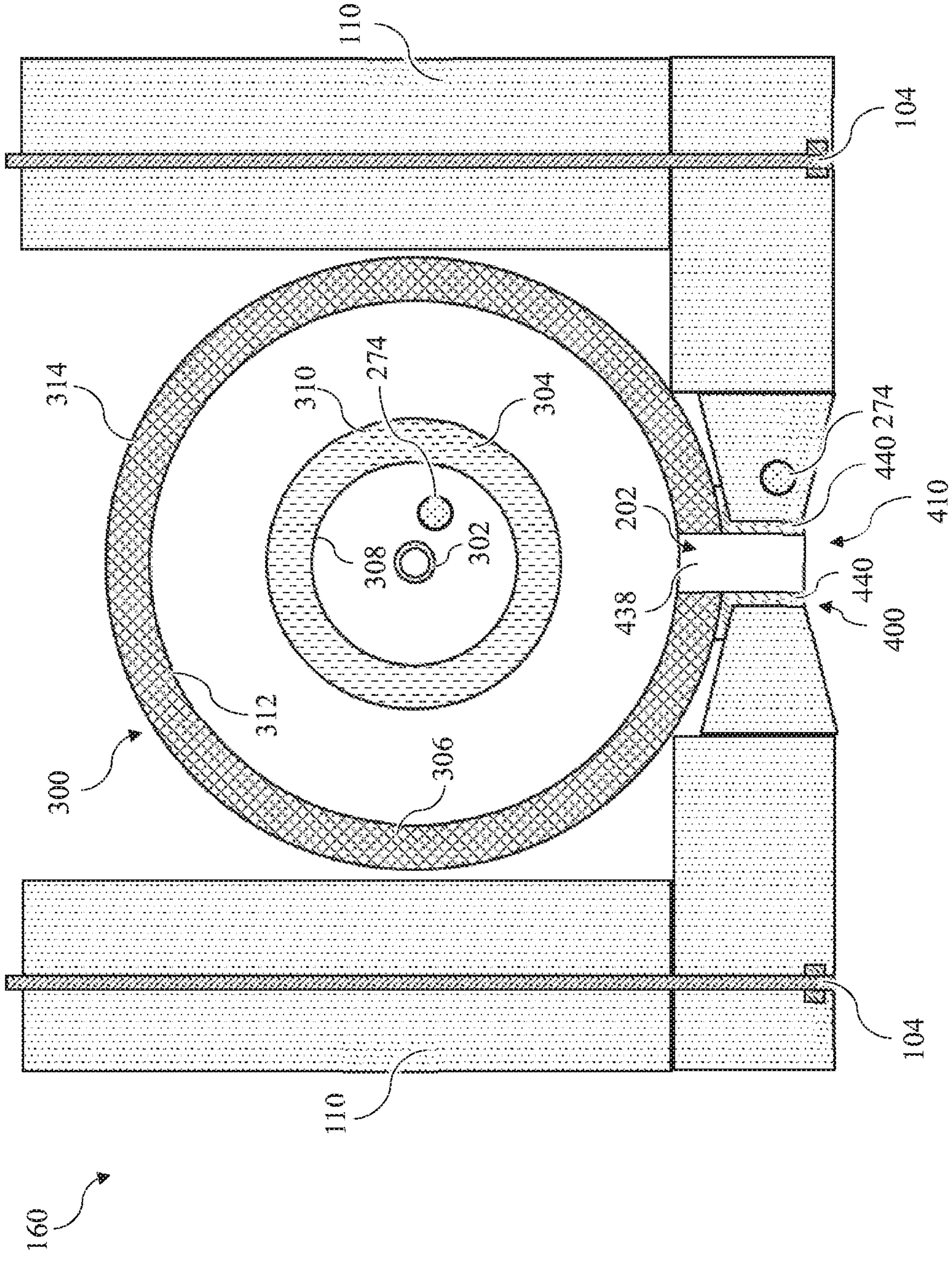

FIG. 21 schematically depicts a distributor assembly according to one or more embodiments shown and described herein.

Figure 22:
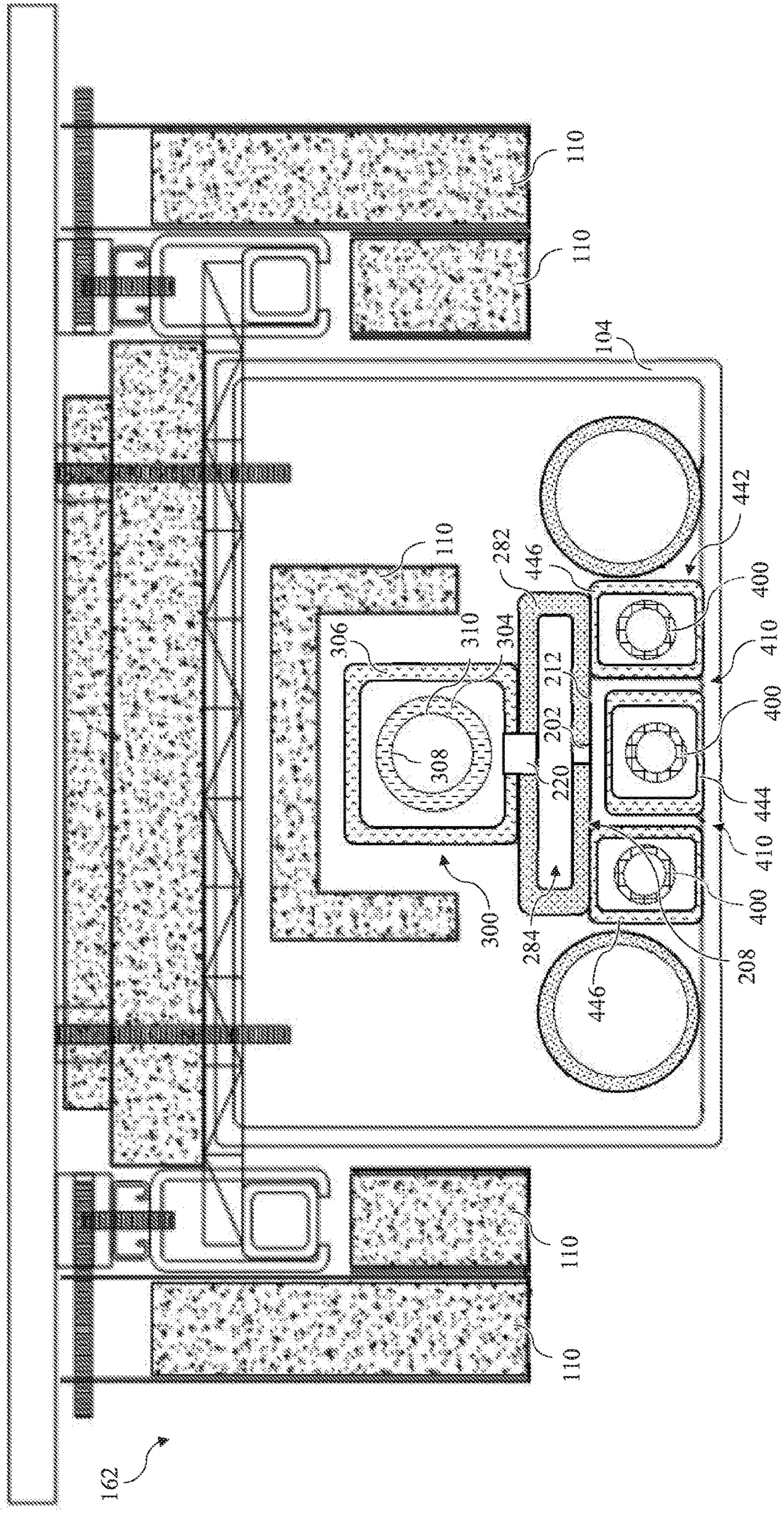

FIG. 22 schematically depicts a distributor assembly according to one or more embodiments shown and described herein.

Figure 23:
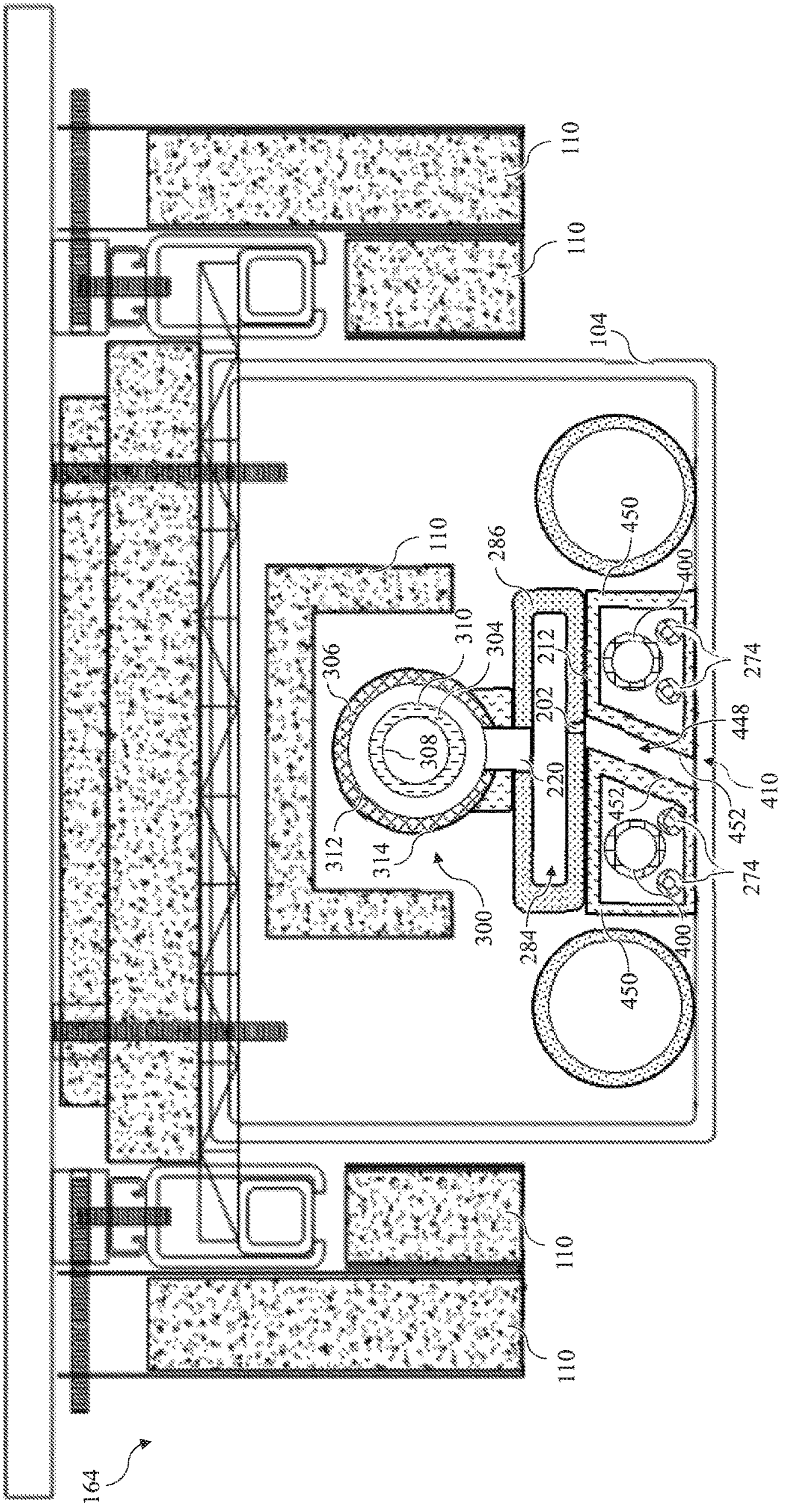

FIG. 23 schematically depicts a distributor assembly according to one or more embodiments shown and described herein.

DETAILED DESCRIPTION

Provided herein are distributor assemblies for VTD systems, and methods of vapor transport deposition. The distributor assemblies and methods represent improvements in the areas of powder vaporization, thermal management, and vapor transport to the substrate. These improvements include uniform vaporization and distribution of vapors in longer distributors for uniform film deposition along wide glass substrates (e.g., about 1.2 m wide), and better structural integrity of a larger (about 2.5 m wide) distributor assembly at high temperatures. The distributor assemblies provided herein, in some embodiments, can accommodate about 1100° C. vaporization at high temperatures, without sourcing trace elements from the heating elements. Furthermore, the distributor assemblies can, in some embodiments, prevent condensation of vapors in the distributor manifold by selectively heating the manifold, and minimize heating of the substrates by radiation from the distributor assembly so as to prevent unwanted melting or softening of the glass substrates.

Referring now to the figures, wherein like reference numerals designate identical or corresponding parts throughout the several views, FIG. 3 schematically depicts a processing system 30. The processing system 30 can include apparatus 32 constructed to perform a method of depositing material on a substrate. Both the apparatus 32 and the method of depositing the material are more fully described below. The processing system 20 can process a substrate 34 (for example, a glass sheet) for deposition of a material (for example, a semiconductor material, such as a II-VI semiconductor, including CdTe, CdSe, and CdS). The system 10 can include a housing 36 defining a processing chamber 38 in which a material is deposited on substrate 34. Housing 36 includes an entry station 40 and an exit station 42. The entry station 40 and exit station 42 can be constructed as load locks or as slit seals through which the glass sheet substrates 34 enter and exit the processing chamber 38. The interior of housing 36 can be heated in any desired processing temperature, as provided herein.

The processing system 30 can include a distributor assembly 100. The distributor assembly 100 can be located above a conveyor 44 so as to deposit the material on the upwardly facing surface 46 of the substrate 34. Furthermore, the conveyor 32 can be of the roll type including rolls 48 that support the downwardly facing surface 50 of the substrate 34 for its conveyance during processing. The distributor assembly 100 can be used with a vacuum drawn in the processing chamber 38 such as, for example, in the range of 1 to 50 Torr. Accordingly, the processing system 10 can include a suitable exhaust pump 52 for exhausting the processing chamber 38 of the housing 36 both initially and continuously thereafter to remove carrier gases and secondary gases.

Referring collectively to FIGS. 3, 4, and 5, embodiments of the distributor assembly 100 provided herein can include a manifold 200, at least one vaporizer 300, and at least one heater 400, which is distinct from the vaporizer 300. The vaporizer 300 can be supported on, attached to, or otherwise in fluid communication with, the manifold 200, and is configured to vaporize a powder of a semiconductor material, such as a CdTe powder, a CdSe powder, or the like. The heater 400 can also be supported on, attached to, or otherwise in thermal communication with the manifold 200, and is configured to heat at least a portion of the manifold 200 so as to prevent condensation of the semiconductor material on the manifold 200. The manifold 200 generally includes at least one slot or nozzle 202 (where "nozzle" may also be referred to as a "jet") configured to direct vaporized semiconductor material onto passing substrates 34, which can be transported along a path underneath the distributor assembly 100 on a rolling conveyor 44 or the like. In some embodiments, the manifold 200 can act as a structural support for the vaporizer 300. Alternatively or additionally, the manifold 200 can act as a structural support for the heaters 400. Optionally, in alternative embodiments, the manifold 200 does not act as a structural support.

In some embodiments, the vaporizer 300 is designed to perform the single function of vaporizing the powder, and do nothing more than vaporize the powder. In other words, a substantial portion (i.e., at least 70%, or at least 80%, or at least 90%) of the energy supplied to the vaporizer 300 is utilized to vaporize the powder, and not to perform some other heating function (e.g., heating the manifold 200). In use, a feed of semiconductor powder is introduced into the distributor assembly 100, where it is vaporized by the vaporizer 300. The semiconductor vapor, which is carried through the distributor assembly 100 by an inert carrier gas. For example, the semiconductor material powder can be transported by the carrier gas into vaporizer 300 through injector ports 302. Where the semiconductor vapor is directed by the nozzles 202 to the passing substrates 34, where the semiconductor material is deposited thereon. The heater 400, distinct from the vaporizer 300, heats the manifold 200 so as to prevent condensation of the semiconductor vapor on the lips of the manifold 200. Thus, also provided herein is a method of conducting vapor transport deposition that involves vaporizing a semiconductor material in a distributor assembly 100 with a vaporizer 300 configured to selectively heat the powder source so as to not substantially heat other components of the distributor assembly 100, and allowing the vaporized semiconductor material to be deposited onto a substrate 34 moving past the distributor assembly 100. In some embodiments of the method, a heater 400 distinct from the vaporizer 300 is utilized to heat the manifold 200 so as to prevent condensation of the semiconductor material on the manifold 200.

In some embodiments, the distributor assembly 100 allows for large scale deposition by providing a vapor curtain 204 greater than 1 m in size. In some embodiments, the distributor assembly 100 achieves deposition rates of about 0.5 microns per second. In some embodiments, the distributor assembly 100 achieves deposition rates of about 1.0 microns per second. In some embodiments, the distributor assembly 100 achieves deposition rates of about 1.5 microns per second.

Various other features may be included in the distributor assembly 100. For example, insulation 102 may be provided in various places around elements in the distributor assembly 100. Similarly, cradles 104 for suspending the distributor assembly 100 may be provided, such as in the cold zones of the distributor assembly 100. Also, in some embodiments, the distributor assembly 100 includes a filter to remove particles from the vapor. In some embodiments, the SiC present in one more parts of the distributor assembly 100 acts as the filter, because SiC is porous.

Referring still to FIGS. 3, 4, and 5, the vaporizer 300 of the distributor assembly 100 can include a permeable wall vaporizer 304 surrounded by a shroud 306. The permeable wall vaporizer 304 can be of a tubular shape having an elongated construction. The permeable wall vaporizer 304 is heated during use. When permeable wall vaporizer 304 is electrically conductive, it can be heated by application of a voltage along the length of the permeable wall vaporizer 304. The voltage is applied by electrical connections at first end 106 and a second end 108 of the distributor assembly 100. This voltage causes an electrical current to flow along the length of the permeable wall vaporizer 304, electrically heating the permeable wall vaporizer 304 during processing. The permeable wall vaporizer 304 can be heated to a temperature ranging from about 850° C. to about 1150° C. The injector ports 302 can introduce a carrier gas and the semiconductor material to be deposited into the permeable wall vaporizer 304. Inside the permeable wall vaporizer 304 the semiconductor material is heated to a delivery temperature to provide a semiconductor vapor.

Accordingly, the semiconductor material can be initially contained within a flow path demarcated by an inner surface 308 of the permeable wall vaporizer 304. A wall thickness of the permeable wall vaporizer 304 can be defined between the inner surface 308 and an outer surface 310 permeable wall vaporizer 304. The semiconductor vapor can pass outwardly through wall thickness of the permeable wall vaporizer 304 during processing. Thus, the semiconductor vapor can be filtered by the permeable wall vaporizer 304. The delivery temperature is selected in combination with a pressure inside the processing chamber 38 to provide a suitable vapor pressure of the material. The permeable wall vaporizer 304 can be made of any permeable material such as, for example, silicon carbide (SiC), or permeable carbon. In some embodiments, the permeable material that is preferably electrically conductive to provide the heating in the manner disclosed.

The shroud 306 can be configured to provide a flow path substantially surrounding the outer surface 310 of the permeable wall vaporizer 304. Specifically, the shroud 306 can be a substantially tubular body having a wall thickness defined between an inner surface 312 and an outer surface 314. The flow path can be bounded by the inner surface 312 of the shroud 306. The inner surface 312 of the shroud 306 can face the outer surface 310 of the permeable wall vaporizer 304. In some embodiments, the shroud 306 and the permeable wall vaporizer 304 can be concentric with the permeable wall vaporizer 304 provided within the inner surface 312 of the shroud 306. The flow path bounded by the inner surface 312 of the shroud 306 can promote mixing of the semiconductor vapor such as, for example, with carrier gas or secondary gas provided via the injector ports 302. The shroud 306 can be formed from a ceramic material such as, for example, mullite, or the like.

The distributor assembly 100 can include a manifold 200 configured to distribute semiconductor vapor along the vapor curtain 204. A channel 206 can be formed within the manifold 200. The channel 206 provides a flow path along a substrate facing portion 208 of the manifold 200 for the distribution of semiconductor vapor via nozzles 202 formed through the substrate facing portion 208 of the manifold 200. The channel 206 can have a substantially circular cross-section that is sized to promote the delivery and mixing of semiconductor vapor. In some embodiments, the channel 206 can have a diameter Φ of between about 40 mm and about 70 mm. In some embodiments, each nozzle 202 can be formed as a hole machined through the substrate facing portion 208 of the manifold 200, i.e., a hole that extends through an inner surface 210 and an outer surface of the manifold 200 at the substrate facing portion 208 of the manifold 200. The semiconductor vapor can be controlled by angled geometry of the nozzles 202. Specifically, the nozzles 202 can be directed at nozzle angle θ relative to the normal of the upwardly facing surface 46 of the substrate 34. In some embodiments, the nozzle angle θ can be acute such as, for example, less than about 30° in one embodiment, or less than about 20° in another embodiment. As depicted in FIG. 5, the nozzles 202 can be formed in a lip 214 of the manifold 200, which can be pointed upwards such that the nozzles 202 provide mixing of semiconductor vapors before the semiconductor vapors condense on the substrate 34. The manifold 200 can be formed from a machinable and chemically stable material, at operating temperatures, such as, for example, graphite, or the like. Accordingly, in some embodiments, the manifold 200 can be formed from materials more readily machinable than SiC.

Referring still to FIGS. 3, 4, and 5, the distributor assembly 100 can include one or more heaters 400 configured to heat the manifold 200, which can mitigate heat loss of the vaporizer 300 to the manifold 200. Thus, the vaporizer 300 and the manifold 200 can be separately heated. For example, the heaters 400 can heat the lip 214 of the manifold 200 and the areas of the manifold 200 surrounding the nozzles 202. In some embodiments, the heaters 400 can heat the lip 214 of the manifold 200 and the area of the manifold 200 surrounding the nozzles 202 to a temperature of at least about 850° C. such as, for example, at least about 900° C. in one embodiment. For example, the portions of the manifold 200 between the substrate facing portion 208 of the outer surface 212 and the channel 206. Accordingly, condensation of semiconductor vapor on the lip 214 of the manifold 200 can be mitigated. The heaters 400 can span the nozzles 202 of the manifold 200 and can be formed from electrically conductive material such as, for example, nichrome coils, silicon carbide tubes, or the like. For example, the heaters 400 can be formed from silicon carbide tubes that are heated in manner substantially similar to the permeable wall vaporizer 304. Alternatively or additionally, the heaters 400 can include resistance heating wires disposed inside a tube. For example, the heating wires can be formed from SiC or nichrome, and the tubes can be formed from quartz or mullite. In some embodiments, each tube can contain multiple heating wires to form zones along the length of the distributor assembly 100, as needed to achieve the desired temperature profile of the manifold 200. For example, the wires can be divided into three zones, i.e., left, center, and right.

In some embodiments, the distributor assembly 100 can include beams 402 configured to support the distributor assembly 100 above the substrate 34. Specifically, the beams 402 can span across a gap formed between cradles 104. The mass of the manifold 200, the vaporizer 300, and the heaters 400 can be carried by the beams 402. Accordingly, the distributor assembly 100 can be suspended above the substrate 34. The beams 402 can be of a tubular shape having an elongated construction. In some embodiments, the beams 402 can have a substantially circular or substantially rectangular cross-section. Accordingly, the beams 402 can have an inner surface 404 surrounding an inner cavity, and a thickness defined between the inner surface 404 and an outer surface 406.

Each heater 400 can be disposed within the inner cavity of a beam 402. Accordingly, the beams 402 can be heated internally and the heaters 400 can be operated at operating temperatures described herein with low risk of impurity contamination. In some embodiments, the outer surface 406 can be coated with a low emissivity coating such as, for example, $Al_2O_3$, $Y_2O_3$, or the like. Specifically, the substrate facing portions 408 of the outer surface 406 can be coated with the low emissivity coating. As a result, the emission of radiant thermal energy from the beams 402 can be reduced and heat transfer from the heaters 400 to the substrate 34 can be reduced.

Two beams 402 can be disposed across from one another to form a flux exit slot 410. Specifically, each of the beams 402 can have a slot bounding face 412 that bounds the flux exit slot 410. In embodiments, where the beams 402 have a substantially rectangular cross-section, the slot bounding face can be a substantially flat side of the outer surface 406 of the beam 402. The manifold 200 can be disposed above (e.g., the direction away from the substrate 34) the beams 402 such that the nozzles 202 terminate in or immediately adjacent to the flux exit slot 410. Accordingly, semiconductor vapor can flow from the channel 206 of the manifold 200 into the flux exit slot 410 via the nozzles 202. The nozzle angle θ can promote mixing of the semiconductor vapor prior to being directed towards the substrate 34 via the flux exit slot 410. The outer surface 406 of the beams 402 can be in direct contact with the substrate facing portion 308 of the outer surface 212 of the manifold 200. Accordingly, the beams 402 can transfer heat to the manifold 200 via thermal conduction. Indeed, the direct contact and thermal conduction between the manifold 200 and the beams 402 can be provided adjacent to the nozzles 402. As a result, heating for vaporization and flux exit slot 410 can be provided separately.

Referring still to FIGS. 3, 4, and 5, the vaporizer 300 can be disposed above the manifold 200, i.e., the manifold 200 is positioned between the vaporizer 300 and the heaters 400. For example, the vaporizer 300 can be positioned at an opposite side 216 of the manifold 200 from the substrate facing portion 208 of the manifold 200. Optionally, the outer surface 212 at the opposite side 216 of the manifold 200 can have a relief feature 218 formed therein. The relief feature 218 and the outer surface 308 of the vaporizer 300 can be correspondingly shaped. In some embodiments, one or more graphite pads can be positioned in the relief feature 218 to provide a space between the outer surface 308 of the vaporizer and the relief feature 218. Generally, the mass or load of the vaporizer 300 can be carried by the manifold, which is supported by the beams 402 that span the gap between the cradles 104.

The distributor assembly 100 can include a cross-over port 220 configured to provide a flow path for the flow of semiconductor vapor from the vaporizer 300 to the manifold 200. Specifically, the cross-over port 220 can provide a flow path that extends through the inner surface 312 and outer surface 314 of the shroud 306 and the outer surface 212 and the inner surface 210 of the manifold 200. In some embodiments, the cross-over port 220 can extend through the relief feature 218 of the manifold 200. Generally, the cross-over port 220 can provide a flow path that allows semi-conductor vapor in the flow path substantially surrounding the outer surface 310 of the permeable wall vaporizer 304 to flow into the cavity 206 of the manifold 200.

According to the embodiments described herein, the distributor assembly 100 can be substantially surrounded by thermal insulation 110. The thermal insulation 110 can be in contact with the vaporizer 300 and the manifold 200. In some embodiments, the thermal insulation 110 can be in contact with the outer surface 212 of the manifold 200. For example, the thermal insulation 110 can be in contact with one or more faces 222 of the outer surface 212, but not the substrate facing portion 208 and the opposite side 216 of the outer surface 212 of the manifold. Alternatively or additionally, the thermal insulation 110 can contact the beams 402. Accordingly, the mass or load of the thermal insulation 110 can be supported by the beams 402.

Referring now to FIG. 6A, another embodiment of the distributor assembly 120 is schematically depicted. The distributor assembly 120 is similar to distributor assembly 100 and provides a similar function. Accordingly, the cross-sectional view depicted in FIG. 6A is analogous to the cross-sectional view of FIG. 5 and is provided to depict some alternative features of the distributor assembly 120. The distributor assembly 120 can include a manifold 230 having two channels 206 formed therein. Each channel 206 can receive semiconductor vapor from a vaporizer 300 via cross-over port 220. The vaporizers 300 can be suspended from the substrate facing portion 208 of the outer surface 212 of the manifold 230. The vaporizers 300 can be offset from one another to define the flux exit slot 410.

Referring collectively to FIGS. 6A and 6B, a distributor assembly 121 is schematically depicted. The distributor assembly 121 is similar to the distributor assembly 120, except the manifold 131 of the distributor assembly 121 includes a single channel 206 formed therein. The use of a single channel 206 can reduce the weight of the manifold 231 compared to the manifold 230, which in turn can reduce stress on the vaporizers 300. The nozzles 202 of the manifold 231 can be provided off-center with respect to the vaporizers 300, to enhance mixing of the semiconductor vapor prior to traversing the flux exit slot 410. Specifically, the nozzles 202 can be aligned with the outer surface 314 of one of the vaporizers 300. Additionally, the cross-over ports 220 can be aligned at a port angle α with respect to normal of the substrate 34 (FIG. 3). The port angle α can be acute such as, for example, about 20° in one embodiment.

Referring now to FIG. 7, another embodiment of the distributor assembly 122 is schematically depicted. The distributor assembly 122 is similar to distributor assembly 100 and provides a similar function. Accordingly, the cross-sectional view depicted in FIG. 7 is analogous to the cross-sectional view of FIG. 5 and is provided to depict some alternative features of the distributor assembly 122. The distributor assembly 122 can include two heaters 400 provided within beams 402 disposed below and in contact with a manifold 232. The distributor assembly 122 can further include two vaporizers 300, which require only a single point seal, disposed above the manifold 232. Accordingly, the heaters 400 and the vaporizers 200 surround the manifold 232. The distributor assembly can be substantially surrounded by thermal insulation 110. The two vaporizers 300 act predominantly to vaporize the semiconductor material into semiconductor vapor, which flows into a channel 234 of the manifold 232. The manifold 232 acts as a structural support for the vaporizers 300. The manifold 232 can be formed from SiC for enhanced resistance to oxidation.

The heaters 400 for the manifold 232 can reduce the power consumed by the vaporizers 300 during operation. The two heaters 400 can act to heat the manifold 232 and can be operated at lower temperature. The heaters 400 can primarily heat the nozzles 202, which direct the semiconductor vapor into the flux exit slot 410. The beams 402 can reduce the risk of unwanted corrosion of and contamination from the heaters 400. Additionally, the beams 402 can act both as a support and the flux exit slot 410. The beams 402 can be made from recrystallized SiC. In some embodiments, the heaters 400 and the permeable wall vaporizers 304 can be operated in parallel pairs of a single circuit.

Referring now to FIG. 8, another embodiment of the distributor assembly 124 is schematically depicted. The distributor assembly 124 is similar to distributor assembly 122 and provides a similar function. Accordingly, the cross-sectional view depicted in FIG. 8 is analogous to the cross-sectional view of FIGS. 5 and 7 and is provided to depict some alternative features of the distributor assembly 124. The distributor assembly 124 having two vaporizers 300 and two heaters 400 surrounding a manifold 236, where the manifold 236 is formed from $SiO_2$ (e.g., cast-fused $SiO_2$) for improved resistance to oxidation. Like the distributor assembly 122, the heaters 400 for the manifold 236 can reduce the power consumed by the vaporizers 300 during operation. The reduction of power consumption can result in a lower risk of contaminant sourcing from the vaporizers 300. The manifold 236 acts as a structural support for the vaporizers 300. The two vaporizers 300 act predominantly to vaporize the semiconductor material into semiconductor vapor, which flows into a channel 234 of the manifold 236. The two vaporizers 300 require only a single seal. The heaters 400 can primarily heat the nozzles 202, which direct the semiconductor vapor into the flux exit slot 410, and can be operated at lower temperature. Additionally, the heaters 400 can have a secondary use as redundant vaporizers. The manifold 236 can be supported along its full length beams 402, which can be formed from SiC:Si.

Referring collectively to FIGS. 9A and 9B, another embodiment of the distributor assembly 132 is schematically depicted. The distributor assembly 132 is similar to distributor assembly 122 and provides a similar function. Accordingly, the cross-sectional view depicted in FIGS. 9A and 9B are analogous to the cross-sectional view of FIGS. 5 and 7 and are provided to depict some alternative features of the distributor assembly 132. The distributor assembly 132 can include a manifold 240 that is formed as a one-body construction. The manifold 240 can be machined with a channel 242 and nozzles 202 that are precision defined. The manifold 240 can be machined from materials such as, for example, graphite, CFC, or the like. The channel 242 can be sealed with a plate 244 that is glued in place. The plate can be formed from graphite, CFC, or the like. CFC can be relatively strong at high temperatures compared to graphite, which reduces the risk a breaking due to the length of the distributor assembly 132. The one-body construction can result in truer spans compared to tubes formed from mullite, i.e., less curvature along a straight span.

The distributor assembly 132 can include two vaporizers 300, which can be run substantially in parallel. In some embodiments, the vaporizers 300 can be connected to one common vapor duct to achieve desirable vaporization rate. The distributor assembly 132 can include heaters 400 positioned in pockets 246 machined into the manifold 240 can positioned beneath and adjacent to the nozzles 202. The pockets 246 can be sealed with plates as described above. The distributor assembly 132 can be substantially surrounded by thermal insulation 110.

Referring collectively to FIGS. 10A and 10B, a distributor assembly 134 is schematically depicted. Specifically, FIG. 10A depicts a cross-sectional view of the distributor assembly 134 in the cold region, i.e., outside of the vapor curtain, and FIG. 10B depicts a cross-sectional view of the distributor assembly 134 in the cold region, i.e., within the vapor curtain. In some embodiments, the distributor assembly 134 can include two vaporizers 300 connected to a manifold 248 via cross over ports 220. The manifold 248 can have a substantially tubular shape and a substantially circular cross-section. Accordingly, each of the shrouds 306 and the manifold 248 can be formed from an SiC or mullite tube configured within cradles 104. A heater 400 can be positioned within the manifold 400 in a substantially concentric arrangement. Thermowells 137 can be positioned within the heater 400 and the permeable wall vaporizers 304. The thermowells 137 can be a substantially tubular housing for protecting a temperature sensor such as, for example, a thermocouple, a resistance temperature detector, or the like. The manifold 248 can include nozzles 202 over the portion of the length of the distributor assembly 134 for providing a vapor curtain. The nozzles 202 can be positioned over a diffuser 414 such that the semiconductor vapor emitted from the nozzles 202 are mixed in the region bounded by the faces 416 of the diffuser 414 and the outer surfaces 314 of the shrouds 306. Such inter-mixing of semiconductor vapor can reduce film stripping. In some embodiments, the diffuser 414 can be formed from graphite and can have a substantially triangular cross-section.

Referring now to FIG. 11, another embodiment of the distributor assembly 136 is schematically depicted. The distributor assembly 136 is similar to distributor assembly 122 and provides a similar function. Accordingly, the cross-sectional view depicted in FIG. 11 is analogous to the cross-sectional view of FIG. 5 and is provided to depict some alternative features of the distributor assembly 136. The distributor assembly 136 can include two vaporizers 300 with a heater 400 disposed between the vaporizers 300. The vaporizers 400 and heater 400 can be disposed above a manifold 250 relative to the substrate 34 (FIG. 3). The manifold 250 can include two channels 206. Nozzles 202 exiting the channels 206 of the manifold 250 can be pointed upwards to provide mixing of semiconductor vapors before they a distributed via the flux exit slot 410, i.e., the nozzles 202 can be directed away from the substrate 34.

Referring now to FIG. 12, another embodiment of the distributor assembly 138 is schematically depicted. The distributor assembly 138 is similar to distributor assembly 122 and provides a similar function. Accordingly, the cross-sectional view depicted in FIG. 12 is analogous to the cross-sectional view of FIG. 5 and is provided to depict some alternative features of the distributor assembly 138. The distributor assembly 138 can include a vaporizer 300 disposed over a manifold 252. The manifold 252 can be formed from cast SiC and can define a substantially rectangular channel 254. The channel 254 can include a central protrusion 256 formed by the inner surface 210 of the manifold 250 that reduced the interior volume of the channel 254. Nozzles 202 can extend through the central protrusion 256 to allow semiconductor vapor to exit the manifold 252 and travel through the flux exit slot 410. In some embodiments, the manifold 254 can be operated as a heater in a manner analogous to the permeable wall vaporizer 304. Alternatively or additionally, a heater 400 can be provided adjacent to the outer surface 212 of the manifold 250, which can reduce the power required from the vaporizers 300 and can reduce the risk of contaminants sourcing from the vaporizer 300. In some embodiments, the vaporizer 300 can be offset from the outer surface 212 of the manifold 252 by a spacer 140, which can be formed from graphite.

Referring now to FIG. 13, another embodiment of the distributor assembly 142 is schematically depicted. The distributor assembly 142 is similar to distributor assembly 122 and provides a similar function. Accordingly, the cross-sectional view depicted in FIG. 13 is analogous to the cross-sectional view of FIG. 5 and is provided to depict some alternative features of the distributor assembly 142. The distributor assembly 142 can include a vaporizer 300 disposed above a manifold 258 relative to the substrate 34. The manifold 258 can have a substantially rectangular channel 260. Heaters 400 can be supplied below the manifold 258 to help reduce the power required from the vaporizers 300.

The distributor assembly 142 can include a support assembly 418 provided below the nozzles 202 of the manifold 258. The support assembly 418 can form a flow path 420 adjacent to the nozzles 202 for receiving semiconductor vapor. The flow path 420 can be a slot or an aligned set of larger holes. In some embodiments, the support assembly 420 can be formed from partial beams 422. Specifically, the partial beams 422 can have substantially "C" shaped cross sections. The flow path 420 can be formed by placing the partial beams 422 in an offset arrangement with the concave portions of the partial beams 422 facing one another. Slot blockers can be provided as needed. In some embodiments, the partial beams 422 can be cast beams together as a single beam. The heater 400 can be disposed within the support assembly 418.

Referring now to FIG. 14, another embodiment of the distributor assembly 144 is schematically depicted. The distributor assembly 144 is similar to distributor assembly 122 and provides a similar function. Accordingly, the cross-sectional view depicted in FIG. 14 is analogous to the cross-sectional view of FIG. 5 and is provided to depict some alternative features of the distributor assembly 144. The distributor assembly 144 can include a support assembly 424 provided below the nozzles 202 of the manifold 258. The support assembly 424 can form a flow path extending downward from the nozzles 202 and forming the flux exit slot 410. The support assembly 424 can be formed from partial beams 426. Specifically, the partial beams 426 can have substantially "L" shaped cross sections. The flux exit slot 410 can be formed by placing the partial beams 426 in an offset arrangement with the vertical portions of the partial beams 426 facing one another. The heaters 400 can be placed in the open ends of the partial beams 426, providing a large radiating area and ease of assembly.

Referring now to FIG. 15, another embodiment of the distributor assembly 146 is schematically depicted. The distributor assembly can include a manifold 262 formed as an integrated housing. For example, the integrated housing can be cast from silica. Accordingly, the manifold 262 can provide support for and house the key elements of the distributor assembly 146. The distributor assembly 146 is similar to the distributor assembly 121 (FIG. 6B). Specifically, the distributor assembly 146 can include two vaporizers 300 located below the channel 206 of the manifold 262. The heater 400 can be located within the channel 206 of the manifold 262 and adjacent to the nozzles 202. Semiconductor vapor can be distributed centrally from nozzles 202 to the flux exit slot 410, which can be located between the vaporizers 300.

Referring now to FIG. 16, another embodiment of the distributor assembly 148 is schematically depicted. The distributor assembly can include a manifold 264 formed as an integrated housing. The distributor assembly 146 can include two vaporizers 300 located adjacent to the channel 206 of the manifold 264. The heater 400 can be located within a mixing orifice 428 positioned below the nozzles 202 of the manifold 264. Accordingly, the heater 400 can be located adjacent to the nozzles 202. Semiconductor vapor can be distributed centrally from nozzles 202 to the mixing orifice 428, around the heater 400, and through the flux exit slot 410.

Referring now to FIG. 17, another embodiment of the distributor assembly 150 is schematically depicted. The distributor assembly can include a manifold 266 formed as an integrated housing. The distributor assembly 150 can include two vaporizers 300 located adjacent to the channel 206 of the manifold 266. The distributor assembly 150 can include two heaters 400 located below the channel 206 of the manifold 266. The nozzles 202 can be positioned between the heaters 400.

Referring now to FIG. 18, another embodiment of the distributor assembly 154 is schematically depicted. The distributor assembly 154 is similar to distributor assembly 122 and provides a similar function. Accordingly, the cross-sectional view depicted in FIG. 21 is analogous to the cross-sectional view of FIG. 4 and is provided to depict some alternative features of the distributor assembly 154. The distributor assembly 154 can include manifolds 276 that are segmented along the length of the distributor assembly 154. The manifolds 276 can be formed from graphite, and can be less sensitive to uniformity issues due to the reduced span. Gas fed into the injector ports 302 supplying the vaporizer 300 for each manifold 276 can be independently controlled.

Referring now to FIG. 19, another embodiment of the distributor assembly 156 is schematically depicted. The distributor assembly 156 can have a substantially concentric between the vaporizer 300, a manifold 278 and an outer tube 434, i.e., the concentric configuration can have four shells. The concentric arrangement can result in a reduction in radiation heating of the substrate 34. Accordingly, some of the heaters 400 can be eliminated. The cross over port 220 can be provided opposite to the nozzles 202. The flux exit slot 410 can be formed in the outer tube 434 and provided opposite to the nozzles 202, and on the same side of the distributor assembly 156 as the cross over port 220. All of the sealing can be provided in the cold zones of the concentric geometries. The distributor assembly 156 can require relatively less space per assembly, and can be relatively easy to machine. The permeable wall vaporizer 304 may be greater than 54 mm OD to help keep the core temperature down. The manifold 278 can be made from graphite, SiC, or mullite.

Referring now to FIG. 20, another embodiment of the distributor assembly 158 is schematically depicted. The distributor assembly 158 can have a double barrel configuration, i.e., the vaporizer 300 can define a first barrel provided above a lower barrel 436. A manifold 280 can be provided in an inner concentric relation to the lower barrel 436, which can be formed from graphite, SiC, or mullite. A heater 400 can be provided within the channel 206 of the manifold 280. The manifold 280 acts as structural support for the vaporizer 300. The nozzles 202 can be provided offset from the flux exit slot 410. In some embodiments, the nozzles can be angled and pointing up.

Referring now to FIG. 21, another embodiment of the distributor assembly 160 is schematically depicted. The distributor assembly 160 can include a single vaporizer 300. An injector port 302, which can be formed from mullite, can be provided within the permeable wall vaporizer 304. The diameter of the inner surface 308 of the permeable wall vaporizer 304 can be about 70 mm. The diameter of the outer surface 310 of the permeable wall vaporizer 304 can be about 80 mm. During operation, the permeable wall vaporizer 304 can be heated to about 1000° C. The shroud 306, which can be formed from mullite, can have a nozzle 202 formed above the flux exit slot 410. For example, the nozzle 202 can be formed as a 4 mm width slot in the shroud 306. The diameter of the outer surface 314 of the shroud 306 can be about 120 mm. The diameter of the inner surface 312 of the shroud 306 can be about 110 mm.

A heater 400, which heats up to about 800° C., can be provided at the nozzle 202 of the shroud 306. The heater 400 can be formed from graphite felt 438 and L-channel 440. For example, the graphite felt 438 can be formed as a rectangle of about 6 mm×about 20 mm, which is compressible to a 4 mm slot. The L-channel 440 can be bonded to the graphite felt 438. The L-channel 440 can be about 2 mm thick and formed from CFC. Thermal insulation 110 can be formed in a substantially "L" shape cross-section. The thermal insulation 110 can be configured to support the shroud 306. For example, the thermal insulation 110 can be formed from ceramic rigid insulation board and can be about 30 mm thick. The thermal insulation 110 can be suspended from cradles 104 such as, for example, CFC rods and nuts hanging from a lid of the processing chamber 38 (FIG. 3). An additional thermal break may be inserted. A thermocouple 274 can be provided adjacent to the injector port 302 and the permeable wall vaporizer 304. A thermocouple 274 can be provided adjacent to the heater 400 for two heat zone control. Accordingly, the temperature of each of the heater 400 and the vaporizer can be controlled separately.

The distributor assembly 160 avoid the difficulty of forming a cross-over connection. Furthermore, the distributor assembly 160 can address another difficult interface sealing challenge between vaporizer 300 and the flux exit slot 410 via the use of graphite felt 438. The graphite felt 438 can conform to imperfections in mullite tube surface or slot shape with proper compression ratio. The relatively large diameter of the shroud 306 can be used to extend the flux exit slot 410 closer to the center of the vaporizer 300. The permeable wall vaporizer 304 can have a cross-section area about the same size as other configurations, but the diameter of the inner surface 308 and outer surface 310 can be larger. The larger diameter of the inner surface 308 of the distributor assembly 160 helps to spread out more uniform vapor axially and can increase structural strength of the permeable wall vaporizer 304. The shroud 306 of the distributor assembly 160 can be made larger for a similar reason. Additionally, the wall thickness of the shroud 306 of the distributor assembly 160 can be preferably within 50 to 6 mm thick (with consideration for its strength, graphite felt insertion, as well as machining cost). The sizes of the graphite felt 438 and the L-channel 440 are customizable. However, the power consumed by the distributor assembly 160 relatively low due the efficiency of a direct-heating arrangement. A lower power rating and narrow hot surface directly exposed to glass can lower the risk of overheating the glass. The gap size between the flux exit slot 410 and the substrate 34 can be adjusted for process improvement. For example, the distance between the flux exit slot 410 the substrate 34 can be reduced to reduce non-target coating and promote efficient material utilization.

Referring now to FIG. 22, another embodiment of the distributor assembly 162 is schematically depicted. The distributor assembly 162 is similar to distributor assembly 122 and provides a similar function. Accordingly, the cross-sectional view depicted in FIG. 22 is analogous to the cross-sectional view of FIG. 5 and is provided to depict some alternative features of the distributor assembly 162. The distributor assembly 162 can include multiple flux exit slots 410. The distributor assembly 162 can include permeable wall vaporizer 304 surrounded by a shroud 306, which can be formed from SiC and can have a substantially rectangular cross-section. The shroud 306 can communicate semiconductor vapor to a manifold 282 via a cross over port 220. The manifold 282 can surround a channel 284 having a substantially rectangular cross-section. For example, the manifold 282 can be formed from a SiC beam. Semiconductor vapor can be communicated from the manifold 282 via nozzles 202 to the flux exit slots 410.

The distributor assembly 162 can include a support assembly 442 configured to support the manifold 200 and define the flux exit slots 410. The support assembly 442 can include a central beam 444 and two outer beams 446. The central beam 444 and two outer beams 446 can be coated with a low emissivity coating. For example, the low emissivity coating can be applied to the surfaces of the central beam 444 and two outer beams 446 facing the substrates 34. A heater 400 can be disposed within each of the central beam 444 and two outer beams 446. Accordingly, the internal heaters 400 can be operated at high temperatures with low risk of impurity contamination. The outer beams 446 can be offset from the central beam 444 that the flux exit slots 410 are bounded by the outer beams 446 and the central beam 444. In some embodiments, the central beam 444 can be offset from the outer surface 212 of the manifold 282. For example, the outer beams 446 can extend further away from the cradles 104 than the central beam 444. Additionally, the central beam 444 can be aligned with the nozzles 202 such that semiconductor vapor emitted from the nozzles 202 impinge upon the central beam 444. Multiple flux exit slots 410 can reduce peak deposition rate, thereby allowing for higher film quality. The distributor assembly 162 has relatively high durability, and is relatively oxygen (leak) tolerant. The distributor assembly 162 can also be relatively easy to manufacture, requiring minimal SiC machining.

Referring now to FIG. 23, another embodiment of the distributor assembly 164 is schematically depicted. The distributor assembly 164 is similar to distributor assembly 122 and provides a similar function. Accordingly, the cross-sectional view depicted in FIG. 23 is analogous to the cross-sectional view of FIG. 5 and is provided to depict some alternative features of the distributor assembly 164. The distributor assembly 164 can include an angled flow path 448 provided between the nozzles 202 of a manifold 286 and the flux exit slot. 410. Generally, the nozzles 202 of the manifold 286 can be linearly offset from the flux exit slot 410. The manifold 286 can be supported by angled beams 452 each having an angled face 452. The angled beams 452 can be coated with a low emissivity coating. For example, the low emissivity coating can be applied to the surfaces of angled beams 452 facing the substrates 34. A heater 400 and thermocouples 274 can be provided within the angled beams 450. The angled beams 450 are offset from one another such that the angled face 452 of each angled beam 450 is offset from one another. The space between the angled faces 452 can bound the angled flow path 448, which generally is formed at an acute angle with respect to the nozzles 202. The distributor assembly 164 provides similar benefits as the distributor assembly 162. In addition, the angled flow path 448 of the distributor assembly 164 can provide vapor flux directional control by simple angled geometry.

The distributor assemblies and methods described herein improve vapor distribution for vapor transport deposition in structure integrity, sufficient vaporization, uniformity of vapor distribution, chemical stability, reduced condensation in the vapor path, and reduced distributor radiation heat to the substrate. Additionally, the distributor assemblies provided herein are scalable to coat large substrates (e.g., substrates greater than or equal to about 1 m in length and/or width), while minimizing undesirable impurities in the deposited film. Moreover, the methods provide improvement in these areas for next generation VTD process and equipment design.

According to the embodiments, provided herein a distributor assembly can include a vaporizer for vaporizing a semiconductor vapor, a manifold, and a heater separate from the vaporizer. The manifold can include a channel bounded by an inner surface of the manifold, and a nozzle extending through the inner surface and an outer surface of the manifold. The channel can receive the semiconductor vapor from the vaporizer. The semiconductor vapor can flow from the channel and through the nozzle. The heater can be configured to heat the manifold. The manifold can be positioned between the vaporizer and the heater. Accordingly, the heat load on the vaporizer can be reduced by the heater, which is separate and distinct from the vaporizer.

According to the embodiments provided herein, a distributor assembly for a vapor transport deposition system can include a manifold, at least one vaporizer, at least one heater, and a slot or nozzle in the manifold. The at least one vaporizer can be supported on, connected to, or in fluid communication with, the manifold, and configured to vaporize a powder of a semiconductor material. The at least one heater can be supported on, connected to, or in fluid communication with, the manifold, and configured to heat at least a portion of the manifold to prevent condensation on the manifold. The slot or nozzle in the manifold can be configured to direct vapors onto passing substrates. A substantial portion of energy supplied to the vaporizer can be utilized to vaporize the powder.

According to the embodiments provided herein, a method of conducting vapor transport deposition (VTD) can include vaporizing a powder source of a semiconductor material in a distributor assembly with a dedicated vaporizer configured to selectively heat the powder source so as to not substantially heat other components of the distributor assembly; and depositing the vaporized semiconductor material onto a substrate moving past the distributor assembly.

According to any of the embodiments provided above, the distributor assembly of can further include a filter configured to remove particles from the vapor. According to any of the embodiments provided above, the distributor assembly of can include a plurality of vaporizers. According to any of the embodiments provided above, the distributor assembly of can include a plurality of heaters. According to any of the embodiments provided above, the manifold can include graphite, SiC, carbon fiber composite (CFC), or SiO2. According to any of the embodiments provided above, the manifold can consist essentially of graphite. According to any of the embodiments provided above, the vaporizer can include SiC. According to any of the embodiments provided above, the heater can include SiC.

According to any of the embodiments provided above, the distributor assembly can include two vaporizers, two heaters, and a SiC manifold.

According to any of the embodiments provided above, the distributor assembly can be capable of delivering uniform vaporization and distribution of vapors along a ~2 m wide glass substrate.

According to any of the embodiments provided above, the distributor assembly can be configured to administer vaporization up to about 1100° C. without sourcing trace contaminant elements from the heater or the vaporizer, and can be configured to prevent condensation of vapors in the manifold by selectively heating the manifold while minimizing heating of the substrate by radiation from the distributor assembly.

According to any of the embodiments provided above, the distributor assembly can be configured to deposit a semiconductor material onto the substrates at a deposition rate of at least about 0.5 microns per second.

According to any of the embodiments provided above, the distributor assembly can be configured to deposit a semiconductor material onto the substrates at a deposition rate of at least about 1 micron per second.

According to any of the embodiments provided above, the distributor assembly can be configured to deposit a semiconductor material onto the substrates at a deposition rate of at least about 1.5 microns per second.

According to any of the embodiments provided above, the manifold, vaporizer, and heater can be concentric.

According to any of the embodiments provided above, the distributor assembly can have a single vaporizer.

According to any of the embodiments provided above, the distributor assembly can further include a diffuser configured to improve inter-mixing of vapor and reduce film stripping. The diffuser can include graphite.

According to any of the embodiments provided above, the distributor assembly can include two vaporizers on opposing sides of the heater, wherein the vaporizers and the heater are supported on top of the manifold relative to the substrates.

According to any of the embodiments provided above, the slots or nozzles can be angled upward relative to the substrates, so as to provide mixing of vapors before the vapors condense onto the substrate.

According to any of the embodiments provided above, the manifold can include cast SiC that acts as the heater.

According to any of the embodiments provided above, the manifold can include a plurality of SiC beams. One or more nozzles can be formed in the beams. One of the SiC beams can include an internal SiC heater. The SiC beams can include one or more partial beams having heaters configured to be electrically insulated.

According to any of the embodiments provided above, the manifold can define an integrated housing that houses the vaporizer and the heater. The manifold can be cast out of silica.

According to any of the embodiments provided above, the manifold can be a segmented graphite manifold.

According to any of the embodiments provided above, the distributor assembly can be an assembly of four concentric shells. According to any of the embodiments provided above, the distributor assembly can include a double barrel configuration.

According to any of the embodiments provided above, the manifold can be a graphite manifold defining a single channel.

According to any of the embodiments provided above, the manifold can be supported on one or more SiC:Si beams. According to any of the embodiments provided above, the distributor assembly can include internally heated SiC beams.

According to any of the embodiments provided above, the distributor assembly can include SiC beams with graphite manifolds.

According to any of the embodiments provided above, the distributor assembly can include low-emissivity coating on at least one surface, the low-emissivity coating being capable of reducing heat transfer to the passing substrates. The low-emissivity coating can include $Al_2O_3$ or $Y_2O_3$.

According to any of the embodiments provided above, the distributor assembly can include a SiC permeable wall vaporizer surrounded by a SiC shroud, wherein the SiC shroud is disposed adjacent to, and in communication with, a SiC manifold beam comprising showerhead holes for directing vapors. The distributor assembly can include a plurality of SiC beams with internal heaters.

According to any of the embodiments provided above, the distributor assembly can include a plurality of slots or nozzles a slot or configured to direct vapors onto passing substrates.

According to any of the embodiments provided above, the distributor assembly can include a SiC permeable wall vaporizer surrounded by a SiC shroud, supported on a SiC manifold beam, wherein the SiC manifold beam is supported on a SiC diffuser beam having at least one internal SiC heater. The distributor assembly can further include a second SiC diffuser beam comprising internal thermocouples.

According to any of the embodiments provided above, the vaporizer can be within a mullite shroud, and both the mullite shroud and the manifold are in contact with thermal insulation. The thermal insulation can be supported on a plurality of SiC beams, the SiC beams comprising internal SiC heaters.

Certain embodiments of the apparatuses and methods disclosed herein are defined in the above examples. It should be understood that these examples, while indicating particular embodiments, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A distributor assembly comprising:

a vaporizer for vaporizing a semiconductor powder into a semiconductor vapor;

wherein the vaporizer comprises a permeable wall vaporizer;

a manifold comprising a channel bounded by an inner surface of the manifold, and a nozzle extending through the inner surface and an outer surface of the manifold, wherein the channel receives the semiconductor vapor from the vaporizer, and the semiconductor vapor flows from the channel and through the nozzle;

a manifold heater configured to heat the manifold, wherein the manifold is positioned between the vaporizer and the heater; and two beams arranged in parallel, supporting the vaporizer and the manifold thereon, each beam having a slot bounding face and a rectangular cross-section, the slot bounding face of each of the beams defining a flux exit slot between the beams;

wherein the beams span across a gap formed between a plurality of cradles;

wherein the slot bounding face is substantially flat;

wherein the nozzle of the manifold terminates in the flux exit slot;

wherein the manifold heater is disposed within a first one of the two beams;

wherein a source of power is operatively connected to the vaporizer and the manifold heater; and wherein the vaporizer and the manifold are separately heated.

2. The distributor assembly of claim 1, comprising a thermal insulation in contact with the vaporizer and the outer surface of the manifold.

3. The distributor assembly of claim 2, wherein the thermal insulation in contact with the vaporizer and the outer surface of the manifold is suspended from the plurality of cradles.

4. The distributor assembly of claim 1, wherein the manifold heater is configured to heat the first one of the beams.

5. The distributor assembly of claim 1, wherein the beams contact the manifold.

6. The distributor assembly of claim 1, wherein a substrate facing portion of each of the beams is coated with a low emissivity coating.

7. The distributor assembly of claim 6, wherein the low emissivity coating comprises $Al_2O_3$ or $Y_2O_3$.

8. The distributor assembly of claim 1, comprising a thermal insulation contacting the beams such that the thermal insulation is supported by the beams.

9. The distributor assembly of claim 1, wherein the nozzle extends through the outer surface of the manifold at a substrate facing portion of the manifold, and wherein the vaporizer is disposed above at an opposite side of the manifold from the substrate facing portion of the manifold.

10. The distributor assembly of claim 1, wherein the heater heats a lip of the manifold, an area of the manifold surrounding the nozzle, or both to a temperature of at least about 850° C.

11. The distributor assembly of claim 10, wherein the heater heats the lip of the manifold, the area of the manifold surrounding the nozzle, or both to a temperature of at least about 900° C.

12. The distributor assembly of claim 1, wherein the nozzle is directed at nozzle angle $\theta$ relative to normal of a substrate, wherein the nozzle angle $\theta$ is in a range greater than 0 degrees and less than 30 degrees.

13. The distributor assembly of claim 1, further including a second manifold heater disposed within a second one of the two beams.

14. The distributor assembly of claim 1, wherein the plurality of cradles has a U-shaped cross-section.

15. The distributor assembly of claim 1, wherein the permeable wall vaporizer is heated to a temperature in a range from 850° C. to 1150° C.

16. The distributor assembly of claim 1, wherein the distributor assembly has a deposition rate of at least about 1 μm/s to about 1.5 μm/s.

17. The distributor assembly of claim 1, wherein the two beams are comprised of SiC.

18. The distributor assembly of claim 1, wherein at least 80% of power supplied to the permeable wall vaporizer is used to heat and thus vaporize the semiconductor powder.

19. A distributor assembly comprising:

a vaporizer for vaporizing a semiconductor powder into a semiconductor vapor;

a manifold having an inner surface, an outer surface, a channel defined by the inner surface, and a nozzle extending through the inner surface and the outer surface, the channel in communication with the vaporizer and the nozzle;

a plurality of cradles;

two rectangular beams extending longitudinally across a gap between the plurality of cradles, the two rectangular beams arranged in parallel and supporting the vaporizer and the manifold, each of the rectangular beams having a slot bounding face defining a flux exit slot therebetween; and a heater disposed within one of the rectangular beams, the heater in thermal communication with the manifold, whereby at least one of the two rectangular beams is configured to radiate thermal energy during operation of the heater, wherein the nozzle terminates in the flux exit slot, and the slot bounding face of each of the beams is substantially flat.

20. A distributor assembly comprising:

a vaporizer for vaporizing a semiconductor powder into a semiconductor vapor;

a manifold having an inner surface, an outer surface, a channel defined by the inner surface, and a nozzle extending through the inner surface and the outer surface, the channel in communication with the vaporizer and the nozzle;

a plurality of cradles;

two beams extending longitudinally across a gap between the plurality of cradles, the two beams arranged in parallel and supporting the vaporizer and the manifold, each of the two beams having a slot bounding face and a substrate facing face, the slot bounding face of each of the two beams defining a flux exit slot therebetween; and a heater disposed within one of the two beams;

wherein the nozzle terminates in the flux exit slot, the slot bounding face of each of the beams is substantially flat, and the substrate facing face of each of the beams is substantially flat.

* * * * *